(12) United States Patent
Abe et al.

(10) Patent No.: US 8,890,407 B2
(45) Date of Patent: Nov. 18, 2014

(54) SEMICONDUCTOR DEVICE AND LIGHT-EMITTING DEVICE

(75) Inventors: Hiroko Abe, Tokyo (JP); Satoshi Seo, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 97 days.

(21) Appl. No.: 13/464,969

(22) Filed: May 5, 2012

(65) Prior Publication Data

US 2012/0273776 A1    Nov. 1, 2012

Related U.S. Application Data

(62) Division of application No. 12/727,386, filed on Mar. 19, 2010, now Pat. No. 8,174,178, which is a division of application No. 11/254,394, filed on Oct. 20, 2005, now Pat. No. 7,683,532.

(30) Foreign Application Priority Data

Nov. 2, 2004  (JP) ................. 2004-318703

(51) Int. Cl.
| | |
|---|---|
| *H05B 33/00* | (2006.01) |
| *H01L 33/26* | (2010.01) |
| *H01L 33/08* | (2010.01) |
| *H01L 33/40* | (2010.01) |
| *G09G 3/32* | (2006.01) |
| *H01L 27/12* | (2006.01) |
| *G09G 3/20* | (2006.01) |

(52) U.S. Cl.
CPC ........ *H01L 27/12* (2013.01); *G09G 2310/0248* (2013.01); *G09G 3/3258* (2013.01); *G09G 2300/0847* (2013.01); *H01L 27/1214* (2013.01); *G09G 2310/0251* (2013.01); *G09G 3/2022* (2013.01)
USPC ............... 313/506; 313/503; 257/43; 257/99; 257/89

(58) Field of Classification Search
USPC .................................................. 313/504, 506
See application file for complete search history.

(56) References Cited

U.S. PATENT DOCUMENTS

| | | | |
|---|---|---|---|
| 6,249,085 | B1 | 6/2001 | Arai |
| 6,423,429 | B2 | 7/2002 | Kido et al. |

(Continued)

FOREIGN PATENT DOCUMENTS

| | | |
|---|---|---|
| CN | 1297671 A | 5/2001 |
| CN | 1398147 A | 2/2003 |

(Continued)

OTHER PUBLICATIONS

Office Action re Chinese application No. CN 200510118673.8, dated Jul. 11, 2008 (with English translation).

(Continued)

*Primary Examiner* — Ashok Patel
(74) *Attorney, Agent, or Firm* — Husch Blackwell LLP

(57) ABSTRACT

One feature of a semiconductor device of the present invention is to include an electrode that serves as an electrode of a light-emitting element. The electrode includes a first layer and a second layer. Further, end portions of the electrode are covered with a partition layer having an opening portion. Moreover, a part of the electrode is exposed by the opening portion of the partition layer. One feature of a semiconductor device of the present invention is to include an electrode that serves as an electrode of a light-emitting element and a transistor. The electrode and the transistor are connected electrically to each other. The electrode includes a first layer and a second layer. Further, end portions of the electrode are covered with a partition layer having an opening portion. Moreover, the second layer is exposed by the opening portion of the partition layer.

12 Claims, 17 Drawing Sheets

(56) References Cited

U.S. PATENT DOCUMENTS

| | | |
|---|---|---|
| 6,589,673 B1 | 7/2003 | Kido et al. |
| 6,893,744 B2 | 5/2005 | Kim et al. |
| 6,908,695 B2 | 6/2005 | Seo et al. |
| 7,141,817 B2 | 11/2006 | Nishi et al. |
| 7,148,076 B2 | 12/2006 | Seo et al. |
| 7,199,521 B2 | 4/2007 | Ibe |
| 7,205,716 B2 | 4/2007 | Yamazaki et al. |
| 7,387,904 B2 | 6/2008 | Saito et al. |
| 7,413,916 B2 | 8/2008 | Seo et al. |
| 7,683,532 B2 | 3/2010 | Abe et al. |
| 7,732,808 B2 | 6/2010 | Ikeda et al. |
| 2002/0185969 A1 | 12/2002 | Raychaudhuri et al. |
| 2003/0155860 A1 | 8/2003 | Choi et al. |
| 2003/0189401 A1 | 10/2003 | Kido et al. |
| 2005/0012445 A1 | 1/2005 | Yamazaki et al. |
| 2005/0073247 A1 | 4/2005 | Yamazaki et al. |
| 2005/0084712 A1 | 4/2005 | Kido et al. |
| 2005/0106419 A1 | 5/2005 | Endoh et al. |
| 2006/0008740 A1 | 1/2006 | Kido et al. |
| 2006/0087225 A1* | 4/2006 | Liao et al. .................... 313/504 |
| 2006/0246315 A1 | 11/2006 | Begley et al. |

FOREIGN PATENT DOCUMENTS

| | | |
|---|---|---|
| CN | 1440224 A | 9/2003 |
| EP | 0 520 779 A2 | 12/1992 |
| EP | 0 948 063 A2 | 10/1999 |
| EP | 1 089 361 A2 | 4/2001 |
| EP | 1 093 166 A2 | 4/2001 |
| EP | 1 117 277 A1 | 7/2001 |
| EP | 1 524 706 A2 | 4/2005 |
| EP | 1 530 245 A2 | 5/2005 |
| JP | 61-202420 | 9/1986 |
| JP | 5-271118 | 10/1993 |
| JP | 11-251067 | 9/1999 |
| JP | 11-307264 | 11/1999 |
| JP | 2001-102175 | 4/2001 |
| JP | 2001-189192 | 7/2001 |
| JP | 2003-272860 | 9/2003 |
| JP | 2004-234901 | 8/2004 |
| JP | 2004-235128 | 8/2004 |

OTHER PUBLICATIONS

Office Action re Chinese application No. CN 200510118673.8, dated Feb. 27, 2009 (with English translation).

\* cited by examiner

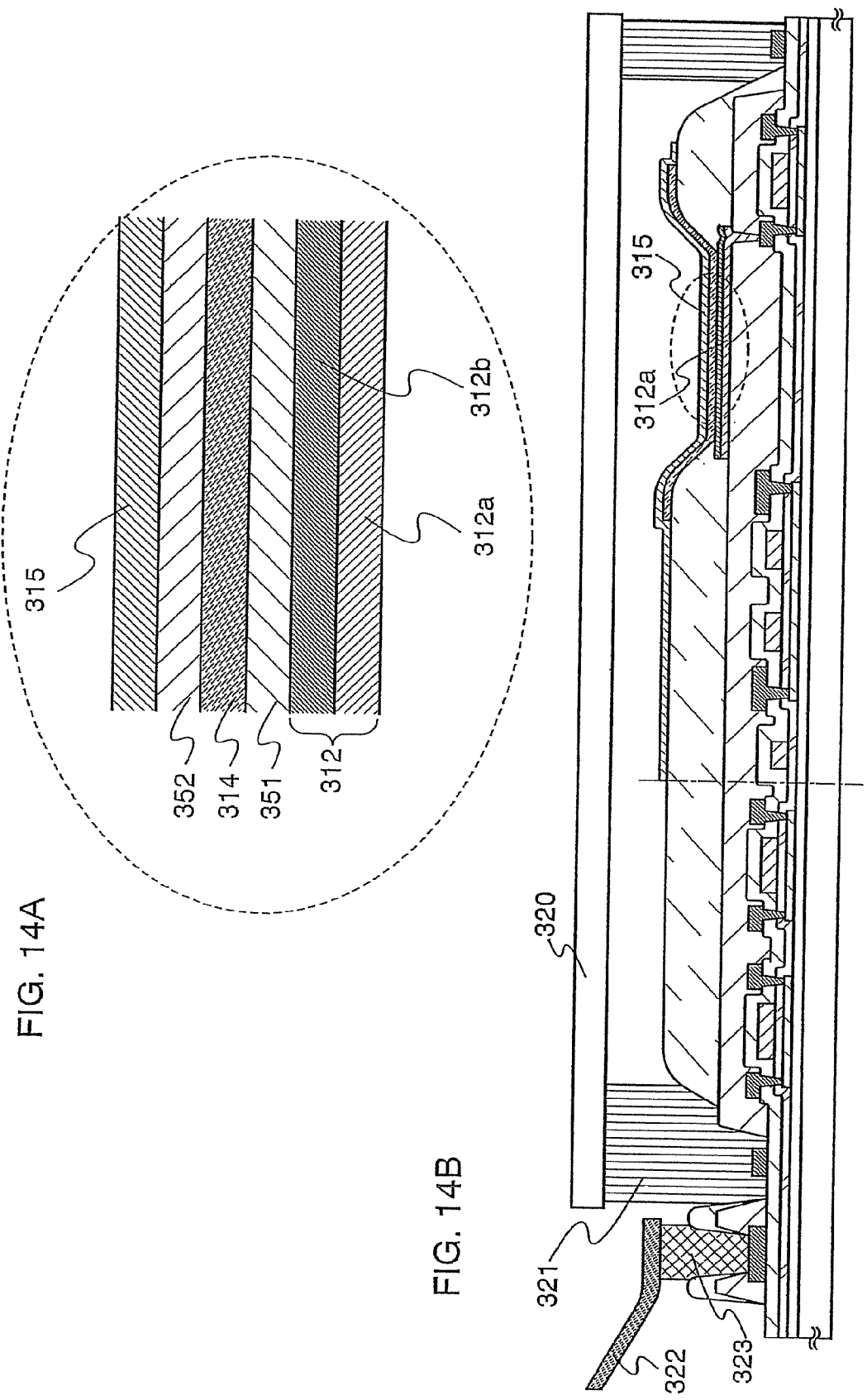

SEMICONDUCTOR DEVICE AND LIGHT-EMITTING DEVICE

This application is a divisional of application Ser. No. 12/727,386 filed on Mar. 19, 2010 now U.S. Pat. No. 8,174,178 which is a divisional of application Ser. No. 11/254,394 filed on Oct. 20, 2005 (now U.S. Pat. No. 7,683,532 issued Mar. 23, 2010).

BACKGROUND OF THE INVENTION

1. Field of the Invention

The present invention relates to a semiconductor device that can be used for manufacturing a light-emitting device, specifically, a structure of a semiconductor device.

2. Description of the Related Art

In recent years, a light-emitting device having a display function has been developed actively. In such light-emitting devices, a light-emitting element is used for a pixel. In a light-emitting device which can display by active matrix driving among the light-emitting devices, a circuit including transistors and the like for driving the light-emitting element is provided, in addition to the light-emitting element. Such a light-emitting device is formed by forming a substrate provided with a circuit and the like, and then, forming a light-emitting element over the substrate as described by Reference 1 (Reference 1: Japanese Patent Laid-Open No. 2001-189192).

SUMMARY OF THE INVENTION

It is an object of the present invention to provide a semiconductor device that can be used for forming a light-emitting device that does not cause defects such as a short circuit between electrodes in a light-emitting element.

One feature of the present invention is to include an electrode serving as an electrode of a light-emitting element. The electrode includes a first layer and a second layer. And end portions of the electrode are covered with a partition layer (also, referred to as a bank) having an opening portion. A portion of the electrode is exposed in the opening portion of the partition layer.

One feature of the present invention is to include an electrode serving as an electrode of a light-emitting element and a transistor. The electrode is electrically connected to the transistor. The electrode includes a first layer and a second layer. And end portions of the electrode are covered with a partition layer having an opening portion. The second layer is exposed in the opening portion of the partition layer.

One feature of the present invention is to include a plurality of combinations of a transistor and an electrode. The electrode serves as an electrode of a light-emitting element. In each combination, the transistor is electrically connected to the electrode. The electrode includes a first layer and a second layer, and the thickness of the second layer is different in each combination. The end portions of the electrode are covered with a partition layer having an opening portion. The second layer is exposed in the opening portion of the partition layer.

In the above described semiconductor device according to the present invention, the first layer is a layer formed using a conductive substance. In addition, the second layer includes a metal oxide and an organic compound. As the metal oxide, either a substance showing electron accepting property to a hole transporting substance or a substance showing electron donating property to an electron transporting substance is preferably used. In addition, as the organic compound, either a hole transporting substance or an electron transporting substance is preferably used. The hole transporting substance herein is a substance that has a property of transporting holes rather than electrons. In addition, the electron transporting substance is a substance that has a property of transporting electrons rather than holes. When the metal oxide is a substance showing electron accepting property to a hole transporting substance in the second layer, the organic compound is preferably the hole transporting substance. Further, when the metal oxide is a substance showing electron donating property to an electron transporting substance in the second layer, the organic compound is preferably the electron transporting substance.

According to the present invention, a semiconductor device including an electrode that has a favorable smoothness and that can be used as an electrode of a light-emitting element, can be provided.

By using a semiconductor device of the present invention, a light-emitting device in which defects such as a short circuit between electrodes of a light-emitting element are reduced, can be manufactured. In addition, an optical path length of light can be adjusted so that light can be extracted from each light-emitting element with good color purity by using a semiconductor device according to the present invention.

BRIEF DESCRIPTION OF THE DRAWINGS

In the accompanying drawings:

FIGS. 14A and 14B each show one mode of a layer structure of a light-emitting element included in a light-emitting device to which the present invention is applied;

DETAILED DESCRIPTION OF THE INVENTION

Figure 1:
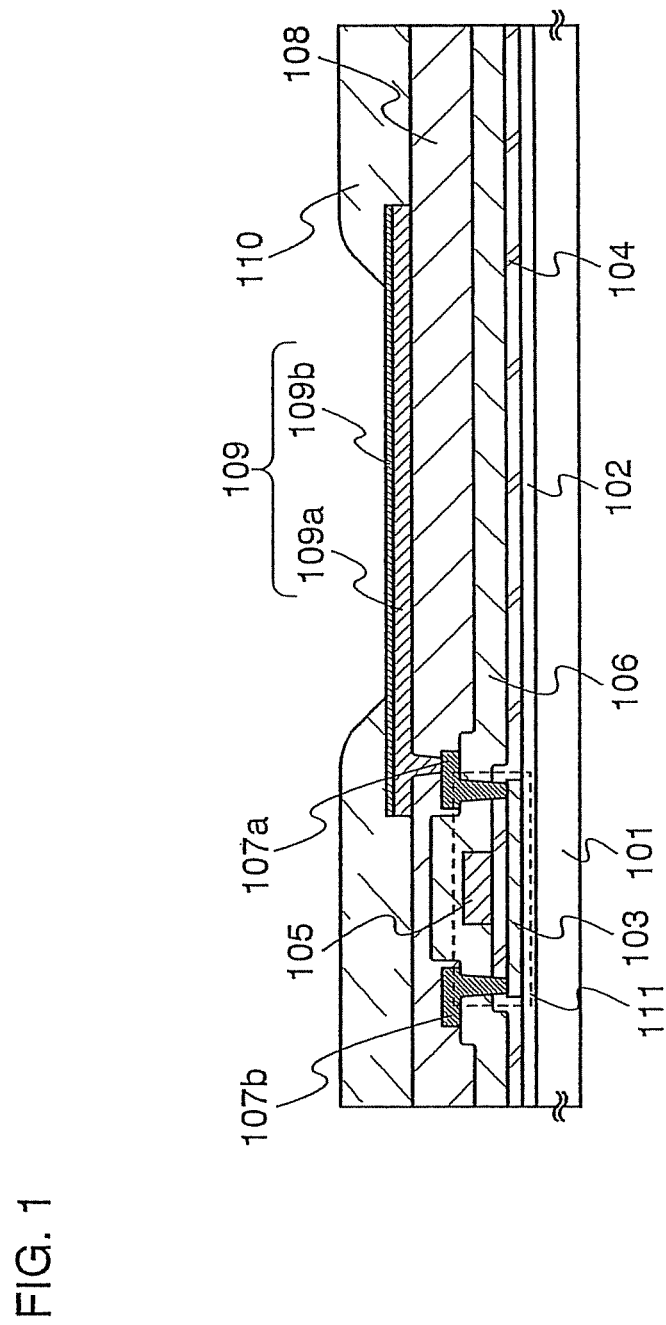
FIG. 1 shows one mode of a semiconductor device according to one aspect of the present invention.

Embodiment Modes according to the present invention will hereinafter be described. The present invention can be carried out in many different modes, and it is easily understood by those skilled in the art that modes and details herein disclosed can be modified in various ways without departing from the spirit and the scope of the present invention. Therefore, it should be noted that the present invention should not be interpreted as being limited to the description of the embodiment modes to be given below.

Embodiment Mode 1

A semiconductor device according to the present invention is described with reference to FIG. 1. An insulating layer 102 is provided over a substrate 101. A transistor 111 including a semiconductor layer 103, a gate insulating layer 104, and a gate electrode 105 is provided over the insulating layer 102. The transistor 111 is covered with an insulating layer 106 having an opening portion. Conductive layers 107a and 107b are provided over the insulating layer 106. In addition, the conductive layers 107a and 107b are in contact with the semiconductor layer 103 through the opening portion provided in the insulating layer 106 and the gate insulating layer 104. It should be noted that the portions of the semiconductor layer 103 that are in contact with the conductive layers 107a and 107b contain impurities at a high concentration. The conductive layers 107a and 107b are covered with an insulating layer 108 having an opening portion. And an electrode 109 including a first layer 109a and a second layer 109b is provided over the insulating layer 108. The electrode 109 is in contact with the conductive layer 107a through the opening portion provided in the insulating layer 108. In other words, the electrode 109 is electrically connected to the transistor 111 through the conductive layer 107a. In addition, end portions of the electrode 109 are covered with a partition layer 110.

The first layer 109a is not necessarily limited. A conductive substance such as indium tin oxide, indium tin oxide including silicon oxide, aluminum, tungsten, tantalum nitride, copper, chromium, titanium or tantalum can be used regardless of a work function of a substance to be used. For example, when light is to be extracted outside through the electrode 109, the first layer 109a may be formed using indium tin oxide, indium tin oxide including silicon oxide, or the like and visible light may be extracted through the electrode 109. In addition, when light is reflected from the electrode 109, the first layer 109a may be formed using aluminum or the like.

The second layer 109b includes a metal oxide and an organic compound. The metal oxide is preferably a substance selected from a substance showing electron accepting property to a hole transporting substance and a substance showing electron donating property to an electron transporting substance. As specific examples of such a substance, alkali metal oxide, alkaline-earth metal oxide and the like such as lithium oxide, calcium oxide, magnesium oxide, sodium oxide and the like are given as well as molybdenum oxide, vanadium oxide, ruthenium oxide, cobalt oxide, copper oxide and the like. A substance selected from a hole transporting substance and an electron transporting substance is preferable. The hole transporting substance here is a substance having property of transporting holes rather than electrons, preferably a substance having hole mobility of $10^{-6}$ cm$^2$/Vs or more. In addition, the electron transporting substance is a substance having property of transporting electrons rather than holes, preferably a substance having electron mobility of $10^{-6}$ cm$^2$/Vs or more. As specific examples of the hole transporting substance, an aromatic amine compound such as 4,4'-bis[N-(1-naphthyl)-N-phenylamino]biphenyl (α-NPD), 4,4'-bis[N-(3-methylphenyl)-N-phenylamino]biphenyl (TPD), 4,4',4"-tris(N,N-diphenylamino)triphenylamine (TDATA), 4,4',4"-tris[N-(3-methylphenyl)-N-phenylamino]triphenylamine (MTDATA), and 4,4'-bis{N-[4-(N,N-di-m-tolylamino)phenyl]-N-phenylamino}biphenyl (DNTPD); a phthalocyanine compound such as phthalocyanine (H$_2$Pc), copper phthalocyanine (CuPc) and vanadyl phthalocyanine (VOPc) can be used. Among them, an aromatic amine compound is preferably used. Note that aromatic amine compound is a compound including a structure shown by the following structural formula (1). By using an aromatic amine compound, accepting and donating of electrons between the hole transporting substance and the substance showing electron accepting property to the hole transporting substance are conducted more smoothly.

Formula 1

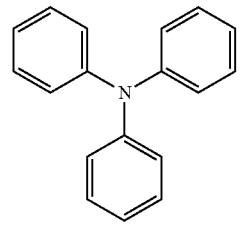

In addition, as specific examples of an electron transporting substance, a metal complex such as tris(8-quinolinolato)aluminum (Alq$_3$), tris(4-methyl-8-quinolinolato)aluminum (Almq$_3$), bis(10-hydroxybenzo[h]-quinolinato)beryllium (BeBq$_2$), bis(2-methyl-8-quinolinolato)-4-phenylphenolato-aluminum (BAlq), bis[2-(2-hydroxyphenyl)benzoxazolato] zinc (Zn(BOX)$_2$), bis[2-(2-hydroxyphenyl)benzothiazolate] zinc (Zn(BTZ)$_2$) can be used. In addition, the following substances can be used as the substance having electron transporting property: 2-(4-biphenylyl)-5-(4-tert-butylphenyl)-1,3,4-oxadiazole (PBD); 1,3-bis[5-(p-tert-butylphenyl)-1,3,4-oxadiazol-2-yl]benzene (OXD-7); 3-(4-tert-butylphenyl)-4-phenyl-5-(4-biphenylyl)-1,2,4-triazole (TAZ); 3-(4-tert-butylphenyl)-4-(4-ethylphenyl)-5-(4-biphenylyl)-1,2,4-triazole (p-EtTAZ); bathophenanthroline (BPhen); bathocuproin (BCP); and the like.

The thickness of the second layer 109b is not necessarily limited; however, it is preferably 50 to 1000 nm, more preferably 100 to 300 nm. Unevenness of the surface of the first layer 109a can be reduced by adopting such a thickness. It should be noted that the second layer 109b is a layer that has a smoothing property since it includes a metal oxide and thus, the organic compound is not easy to be crystallized. As just described, the electrode 109 in which the second layer 109b is stacked on the first layer 109a has a high smoothing property. Thus, when a different layer is stacked over the first electrode 109, it can be stacked with favorable coverage, or without disconnection between the first electrode 109 and the different layer.

The combination of a metal oxide and an organic compound is preferably a combination of a hole transporting substance and a substance showing electron accepting property to the hole transporting substance or an electron transporting substance and a substance showing electron donating property to the electron transporting substance. By combining a metal oxide and an organic compound, electrons or holes are easily generated from the electrode 109.

As described above, the electrode 109 in which the first layer 109a and the second layer 109b are stacked can be used as the electrode of the light-emitting element. By using a semiconductor device having the electrode 109 like the semiconductor device in this embodiment mode, a favorable light-emitting device can be manufactured in which defects such as a short circuit between electrodes of the light-emitting element due to unevenness of the electrode 109 are reduced. In addition, end portions of the electrode 109 are covered by a partition layer 110 as in the semiconductor device of this embodiment mode. Thus, defects of a light-emitting element such as a short circuit due to a concentrated electric field in the end portions of the electrode 109 can be prevented; therefore, a favorable light-emitting device can be manufactured. In a semiconductor device of the present invention, the electrodes 109 corresponding to each light-emitting element are provided separately from each other, and thus crosstalk is not caused between adjacent electrodes 109, and in particular, it is effective for manufacturing a light-emitting device having high-definition pixels.

The substrate 101 is not necessarily limited, and a flexible substrate such as polyethylene terephthalate (PET) or polyethylene naphthalate (PEN) can be used, in addition to a glass substrate or a quartz substrate.

The insulating layer 102 is not necessarily limited, and an insulator such as silicon oxide and silicon nitride can be used. The insulating layer 102 may be a single layer or a multilayer in which a plurality of layers are stacked. By providing the insulating layer 102 between the substrate 101 and the transistor 111, diffusion of impurities from the substrate 101 to the transistor 111 can be prevented.

The transistor 111 is not necessarily limited and either a single gate type transistor or a multigate type transistor having a plurality of gate electrodes may be used. In addition, a transistor having an LDD structure in which an impurity region having a concentration lower than a drain is formed between a channel forming region and the drain may be used. Further, a transistor having a gate-overlapped LDD structure in which a low concentration impurity region formed between a channel forming region and a drain is overlapped with a gate electrode may be used. A top gate type transistor or a bottom gate type transistor may be used.

The semiconductor layer 103, the gate insulating layer 104 and the gate electrode 105 included in the transistor 111 are not necessarily limited.

In addition, the semiconductor layer 103 may be formed using a semi-amorphous semiconductor. The semi-amorphous semiconductor is a semiconductor that has an intermediate structure between an amorphous structure and a crystalline structure (including a single crystal and a polycrystal) and a third state which is stable in terms of free energy, and it includes a crystalline region having short-range order and lattice distortion. At least a part of a region in the film contains a crystal grain of 0.5 nm to 20 nm. A Raman spectrum is shifted to a lower wavenumber side than 520 cm$^{-1}$. Diffraction peaks of (111) and (220) to be caused by a crystal lattice of silicon are observed in X-ray diffraction. Hydrogen or halogen of 1 atomic % or more is included to terminate dangling bonds. It is also referred to as a microcrystal semiconductor. A silane gas ($Si_nH_{2n+2}$, such as $SiH_4$ and $Si_2H_6$), $SiH_2Cl_2$, $SiHCl_3$, $SiCl_4$, $SiF_4$, or the like are decomposed by glow discharge (plasma CVD) to form the semi-amorphous semiconductor. The gas may be diluted with $H_2$, or $H_2$ and one or more rare gas elements of helium, argon, krypton, and neon. A dilution ratio thereof may range from 2 to 1000 times; pressures, approximately 0.1 Pa to 133 Pa; power supply frequency, 1 MHz to 120 MHz, preferably, 13 MHz to 60 MHz. A substrate heating temperature may be 300° C. or less, preferably, 100 to 250° C. An impurity concentration of an atmospheric constituent impurity such as oxygen, nitrogen, or carbon, as an impurity element in the film, is preferably $1×10^{20}/cm^3$ or less; specifically, the concentration of oxygen is $5×10^{19}/cm^3$ or less, preferably $1×10^{19}/cm^3$ or less. Note that the crystallinity of the semiconductor layer 103 has no limitations, for example, the semiconductor layer 103 may be a layer formed using a semiconductor such as silicon or silicon germanium.

The gate insulating layer 104 can be formed using an insulator such as silicon oxide or silicon nitride. The silicon oxide may contain a slight amount of nitrogen and the silicon nitride may contain a slight amount of oxygen. The gate insulating layer 104 may be formed with a single layer of an insulating layer or a multilayer in which a plurality of insulating layers are stacked.

Figure 13:
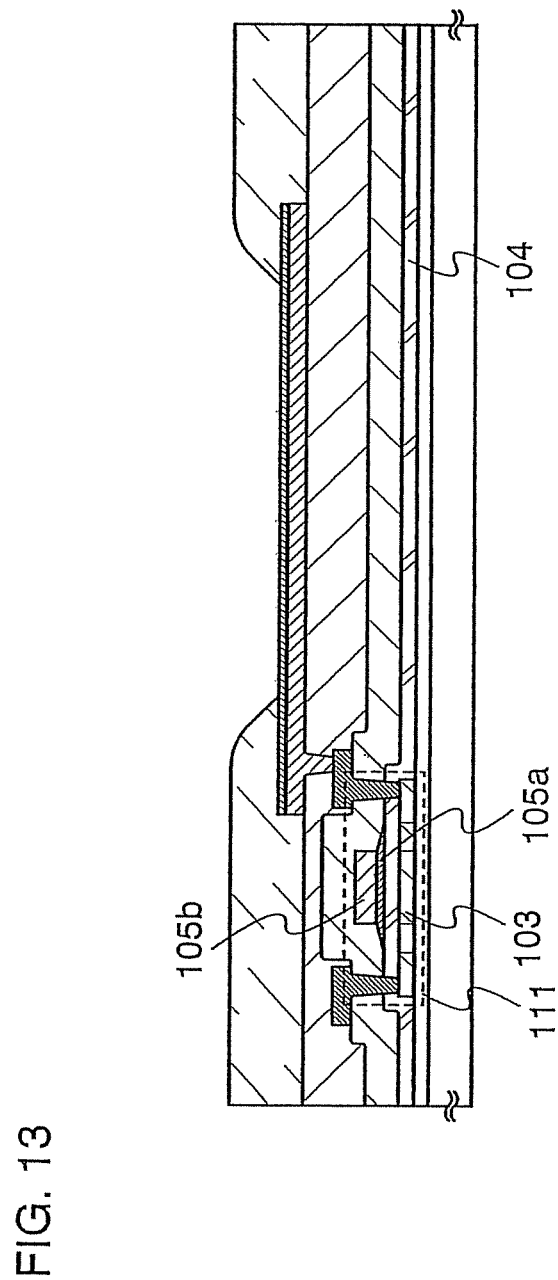
FIG. 13 shows one mode of a semiconductor device according to one aspect of the present invention.

The gate electrode 105 can be formed using a metal nitride such as tantalum nitride or titanium nitride, in addition to metals such as tungsten, aluminum, molybdenum or copper. In addition, the gate electrode 105 may be formed with a single layer of a conductive layer or a multilayer in which a plurality of conductive layers are stacked. For example, as shown in FIG. 13, the gate electrode 105 may have a structure in which the conductive layer 105a and the conductive layer 105b are stacked. In the structure, the sides of the conductive layer 105b are further in from the sides of the conductive layer 105a. The conductive layers 105a and 105b each may have an angled side. The conductive layers 105a and 105b are formed using different substances.

The conductive layers 107a and 107b have no limitations in particular, and can be formed using a metal nitride such as tantalum nitride or titanium nitride, in addition to a metal such as tungsten, aluminum, molybdenum or copper. The conductive layers 107a and 107b may be formed with a single layer of an insulating layer or a multilayer in which a plurality of insulating layers are stacked.

The insulating layers 106 and 108 does not have limitations in particular and can be formed using an insulator such as silicon oxide or silicon nitride. The silicon oxide may contain a slight amount of nitrogen and the silicon nitride may contain a slight amount of oxygen. The silicon nitride may include hydrogen. The insulating layers 106 and 108 may be formed using an organic compound such as acrylic or polyimide, or an insulator such as siloxane. Note that siloxane is a compound that includes elements such as silicon (Si), oxygen (O) and hydrogen (H), and Si—O—Si bond (siloxane bond) (H may be substituted by alkyl group or aryl group). By using acryl, polyimide, siloxane or the like, an insulating layer having a flat surface can be formed like the insulating layer 108 shown in FIG. 1. The insulating layers 106 and 108 may be formed with a single layer of an insulating layer or a multilayer in which a plurality of insulating layers are stacked.

The partition layer 110 has no limitations and is preferably formed so that the side of the partition layer can have a shape with a curvature. The partition layer 110 may be formed using silicon oxide, silicon nitride, siloxane or the like, in addition to an organic compound such as acryl, polyimide or resist.

Embodiment Mode 2

One mode of a light-emitting element manufactured using a semiconductor device of the present invention as described in Embodiment Mode 1 is described with reference to FIGS. 2A to 2C.

Figure 2:
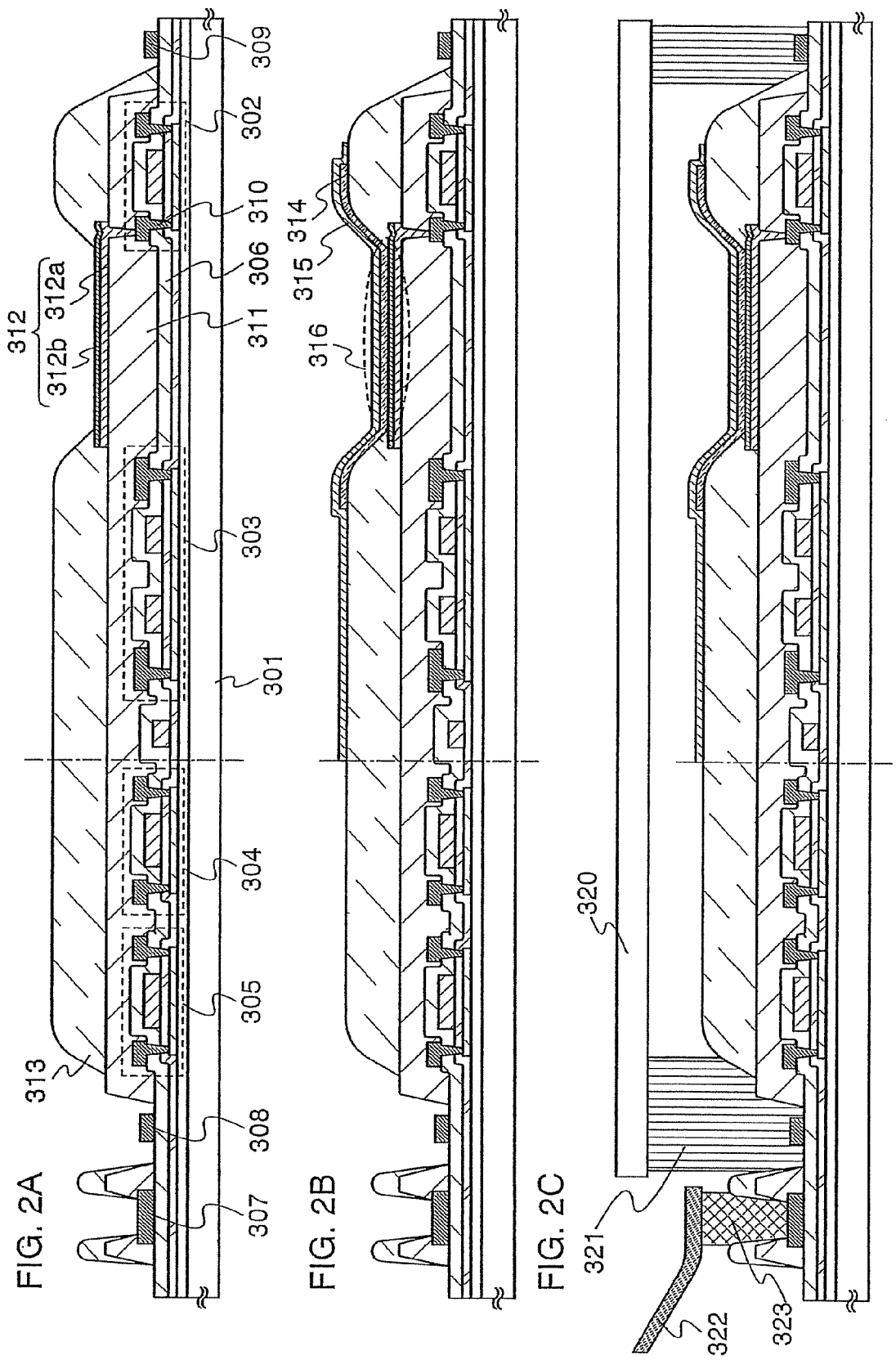
FIGS. 2A to 2C each show one mode of a light-emitting device formed by using a semiconductor device of the present invention.

FIG. 2A is a cross-sectional view of a semiconductor device according to the present invention. Transistors 302, 303, 304 and 305 are formed over a substrate 301. The transistors 302 and 303 are both provided in a pixel region over the substrate 301. The transistors 304 and 305 are provided in a driver circuit region over the substrate 301. The transistors 302 to 305 are covered by an insulating layer 306 having an opening portion. A conductive layer that is processed into a desired shape is provided over the insulating layer 306. Some conductive layers, e.g., conductive layers 307 to 309, each serve as a wiring for inputting a signal or supplying current. The conductive layer 310 is formed to cover the opening portion of the insulating layer 306 and is connected to the transistor 302. Further, the conductive layers 307 to 309 are covered by an insulating layer 311 having an opening portion. An electrode 312 including a first layer 312a and a second layer 312b is formed over the insulating layer 311. The first layer 312a and the second layer 312b are stacked such that the first layer 312a exists on the insulating layer 311 side. The electrode 312 covers the opening portion of the insulating layer 311 and is connected to the conductive layer 310. Further, end portions of the electrode 312 are covered by the partition layer 313 and a part of the electrode 312 is exposed in the opening portion of the partition layer 313.

The first layer 312a corresponds to the first layer 109a and the second layer 312a corresponds to the second layer 109b. In addition, the transistor 302 corresponds to the transistor 111 and the insulating layer 306 corresponds to the insulating layer 106. The conductive layer 310 corresponds to the conductive layer 107a. In addition, the insulating layer 311 corresponds to the insulating layer 108. The partition layer 313 corresponds to the partition layer 110.

A transistor 304 and a transistor 305 for a driver circuit, conductive layers 307 to 309 or the like serving as a wiring or the like may be included in the semiconductor device, as in the semiconductor device as shown in FIG. 2A. In addition, a transistor 303 for a pixel circuit or the like may be provided.

A method for manufacturing a light-emitting device using a semiconductor device as shown in FIG. 2A is described.

First, a light-emitting layer 314 is formed to cover the electrode 312. An electrode 315 is formed over the light-emitting layer 314. An overlapping portion in which the electrode 312, the light-emitting layer 314 and the electrode 315 serves as a light-emitting element 316.

The light-emitting layer 314 may be constituted so that light is emitted from a light-emitting substance when current can flow between the electrode 312 and the electrode 315 and electrons and holes are recombined. The light-emitting substance herein is a substance that has a favorable emission efficiency and that can emit light of a desired emission wavelength.

The method for forming the light-emitting layer 314 is not necessarily limited, and any of an evaporation method, a sputtering method, a spin-coating method, an ink-jet method and the like may be used. In addition, the light-emitting layer 314 may be formed using an inorganic substance or the like in addition to an organic substance.

The light-emitting layer 314 is formed using a light-emitting substance. At this time, the light-emitting layer 314 may be formed such that a light-emitting substance is included to be dispersed in a layer including a substance having an energy gap larger than that of the light-emitting substance. By dispersing the light-emitting substance, quenching of light due to the concentration can be prevented. The light-emitting substance has no limitations in particular. In order to obtain red light emission, substances that can emit light with a peak of emission spectrum in 600 to 680 nm, can be used as a light-emitting substance. For example, 4-dicyanomethylene-2-isopropyl-6-[2-(1,1,7,7-tetramethyljulolidine-9-yl)ethenyl]-4H-pyran (DCJTI); 4-dicyanomethylene-2-methyl-6-[2-(1,1,7,7-tetramethyljulolidine-9-yl)ethenyl]-4H-pyran (DCJT); 4-dicyanomethylene-2-tert-butyl-6-[2-(1,1,7,7-tetramethyljulolidine-9-yl)ethenyl]-4H-pyran (DCJTB); periflanthene; 2,5-dicyano-1,4-bis[2-(10-methoxy-1,1,7,7-tetramethyljulolidine-9-yl)ethenyl]benzene and the like can be used. In order to obtain greenish light emission, substances that can emit light with a peak of emission spectrum in 500 to 550 nm can be used as a light-emitting substance. For example, N,N'-dimethylquinacridone (DMQd), coumarin 6, coumarin 545T, tris(8-quinolinolate)aluminum ($Alq_3$) and the like can be employed. In order to obtain bluish light emission, a peak of emission spectrum in 420 to 500 nm can be used as a light-emitting substance. For example, 9,10-bis(2-naphthyl)-2-tert-butylanthracene (t-BuDNA); 9,9'-bianthryl; 9,10-diphenylanthracene (DPA); 9,10-bis(2-naphthyl)anthracene (DNA); bis(2-methyl-8-quinolinolate)-4-phenylphenolate-gallium (BGaq); bis(2-methyl-8-quinolinolate)-4-phenylphenolate-aluminum (BAlq); and the like can be used. A substance to be used with a light-emitting substance so as to disperse the light-emitting substance has no limitations, for example, an anthracene derivative such as 9,10-di(2-naphthyl)-2-tert-butylanthracene (t-BuDNA); a carbazole derivative such as 4,4'-bis(N-carbazolyl)biphenyl (CBP); a metal complex such as bis[2-(2-hydroxyphenyl)pyridinato]zinc (Znpp2) and bis[2-(2-hydroxyphenyl)benzoxazolato]zinc (ZnBOX); and the like can be used.

The electrode 315 has no limitations in particular. The electrode 315 may be formed using a conductive substance such as indium tin oxide, indium tin oxide including silicon, aluminum, tungsten, tantalum nitride, copper, chromium, titanium, tantalum, and tantalum nitride. In addition, the forming method of the electrode 315 is not necessarily limited, and any of an evaporation method, a sputtering method, an ink-jet method, a spin coating method and the like may be used.

Figure 15A:
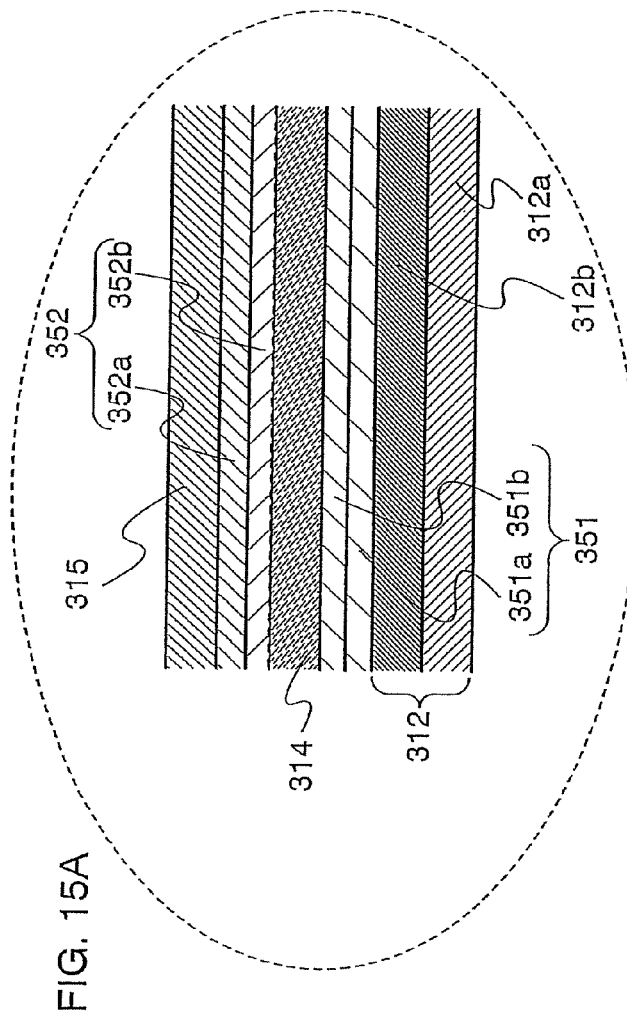
FIGS. 15A and 15B each show one mode of a layer structure of a light-emitting element included in a light-emitting device to which the present invention is applied.
Figure 15B:
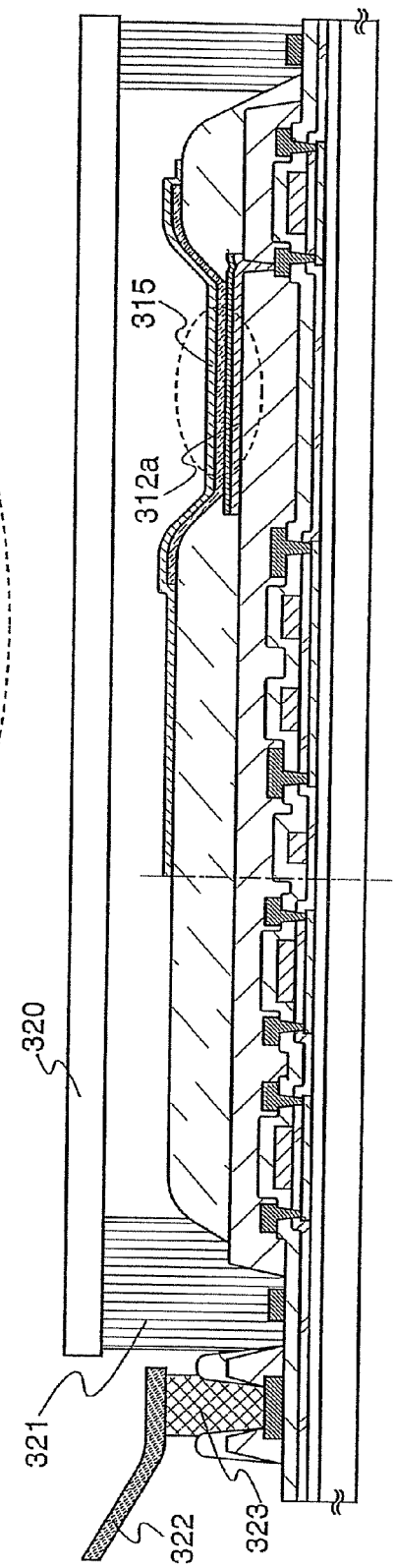
Figure 16A:
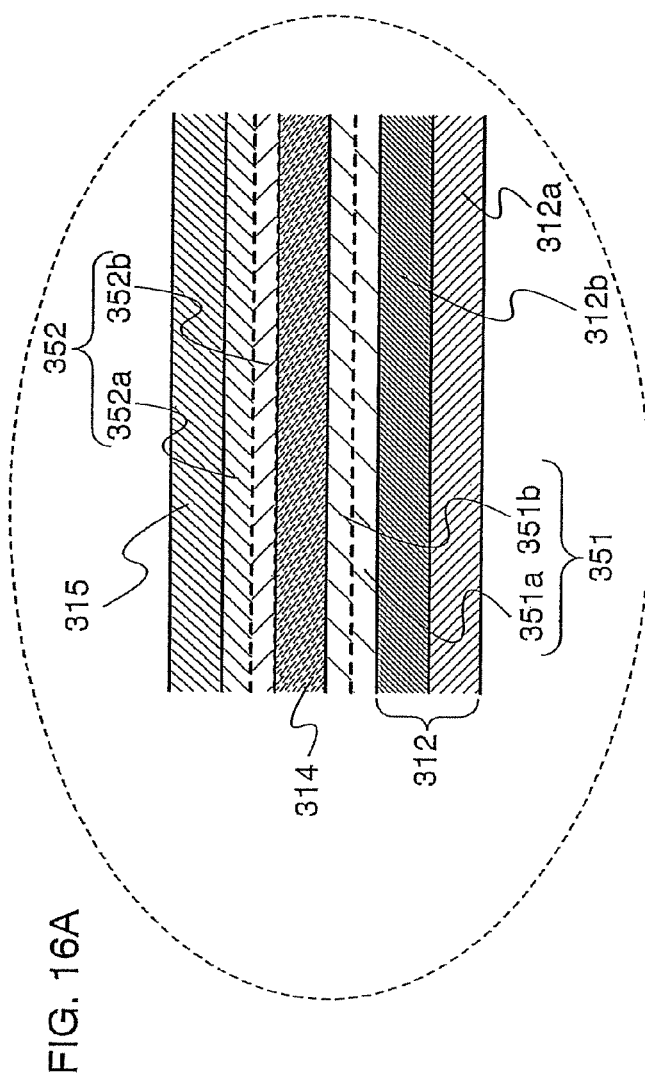
FIGS. 16A and 16B each show one mode of a layer structure of a light-emitting element included in a light-emitting device to which the present invention is applied.
Figure 16B:
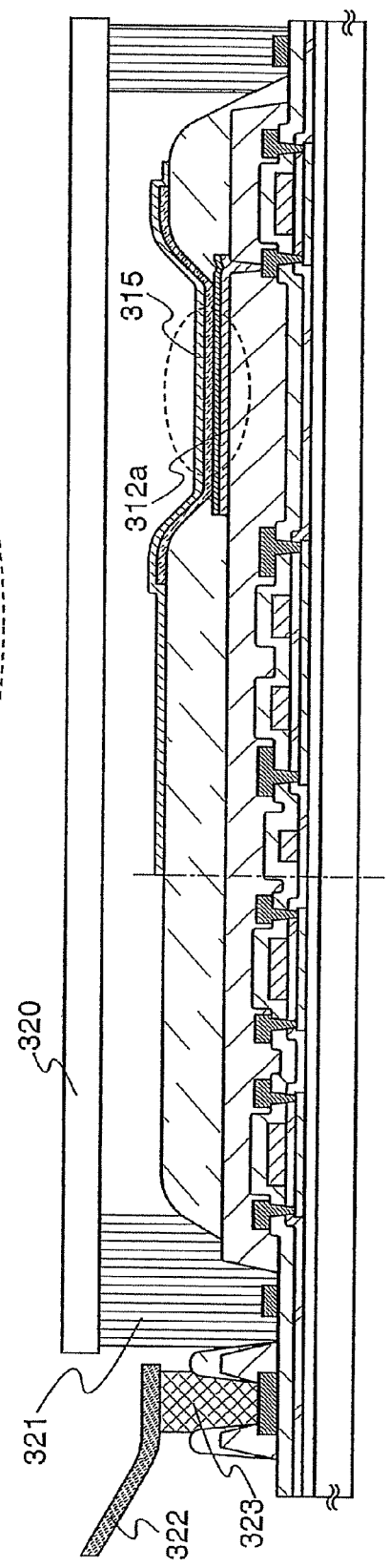

A first transport layer 351 may be provided between the electrode 312 and the light-emitting layer 314 as shown in FIG. 14A. FIG. 14A is an enlarged view of the overlapping portion of the electrode 312, the light-emitting layer 314 and the electrode 315 (a portion surrounded by a dotted line in FIG. 14B). When holes are injected from the electrode 312, the first transport layer 351 is preferably formed using a hole transporting substance. In addition, when electrons are injected from the electrode 312, the first transport layer 351 is preferably formed using an electron transporting substance. In this manner, by providing the first transport layer 351, the electrode 312 can be prevented from becoming closer to the light-emitting layer 314; therefore, quenching of light due to the metal included in the electrode 312 can be prevented. The first layer 351 may be a single layer or a multilayer including the first transport layer 351a, the first transport layer 351b or another layer as shown in FIG. 15A. FIG. 15A is an enlarged view of the overlapping portion of the electrode 312, the light-emitting layer 314 and the electrode 315 (a portion surrounded by a dotted line in FIG. 15B). When the first transport layer 351 is a multilayer and holes are injected from the electrode 312, a layer including a hole transporting substance and a metal oxide such as molybdenum oxide, vanadium oxide or ruthenium oxide, and a layer including only a hole transporting substance may be stacked. In particular, in the case where the hole transporting substance tends to be easily crystallized, crystallization can be prevented by including a metal oxide and a short circuit between electrodes of the light-emitting element due to crystallization can be prevented. The interface between the first transport layer 351a and the first transport layer 351b may be unclear as shown by a dotted line in FIG. 16A. A mixed region of the first transport layer 351a and the first transport layer 351b is preferably formed so that an energy barrier between the first transport layer 351a and the first transport layer 351b can be changed smoothly. In addition, when the first layer 351 is a multilayer and electrons are injected from the electrode 312, a layer including an electron transporting substance and a metal oxide such as lithium oxide, calcium oxide or magnesium oxide and a layer including only an electron transporting substance may be stacked. In particular, in the case where the electron transporting substance tends to be easily crystallized, crystallization can be prevented by including a metal oxide and a short circuit between electrodes of the light-emitting element due to crystallization can be prevented. FIG. 16A is an enlarged view of the overlapping portion of the electrode 312, the light-emitting layer 314 and the electrode 315 (a portion surrounded by a dotted line in FIG. 16B).

A second transport layer 352 may be provided between the electrode 315 and the light-emitting layer 314 as shown in FIGS. 14A and 14B. When electrons are injected from the electrode 315, the second transport layer 352 is preferably formed using an electron transporting substance. When holes are injected from the electrode 315, the second transport layer 352 is preferably formed using a hole transporting substance. In this manner, by providing the second transport layer 352, the electrode 315 can be prevented from becoming closer to the light-emitting layer 314; therefore, quenching of light due to the metal included in the electrode 315 can be prevented. The second transport layer 352 may be a single layer or a multilayer including the second transport layer 352a, the second transport layer 352b or another layer as shown in FIG. 15A. When the second transport layer 352 is a multilayer and electrons are injected from the electrode 315, a layer including an electron transporting substance and a metal oxide such as lithium oxide, calcium oxide or magnesium oxide and a layer including only an electron transporting substance may be stacked. In particular, in the case where the electron transporting substance tends to be easily crystallized, crystallization can be prevented by including the metal oxide and a short circuit between electrodes of the light-emitting element due to crystallization can be prevented. The interface between the second transport layer 352a and the second transport layer 352b may be unclear as shown by a dotted line in FIG. 16A. A mixed region of the second transport layer 352a and the second transport layer 352b is preferably formed so that an energy barrier between the second transport layer 352a and the second transport layer 352b can be changed smoothly. In addition, when the second transport layer 352 is a multilayer and holes are injected from the electrode 315, a layer including a hole transporting substance and a metal oxide such as molybdenum oxide, vanadium oxide or ruthenium oxide and a layer including only a hole transporting substance may be stacked. In particular, in the case where the hole transporting substance tends to be easily crystallized, crystallization can be prevented by including the metal oxide and a short circuit between electrodes of the light-emitting element due to crystallization can be prevented.

Figure 17A:
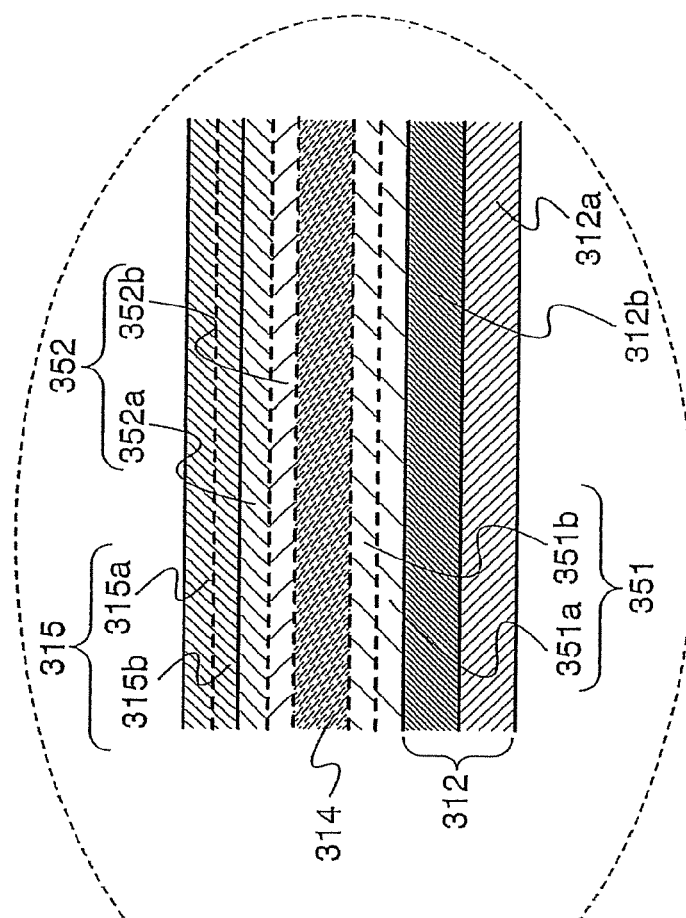
FIGS. 17A and 17B each show one mode of a layer structure of a light-emitting element included in a light-emitting device to which the present invention is applied.
Figure 17B:
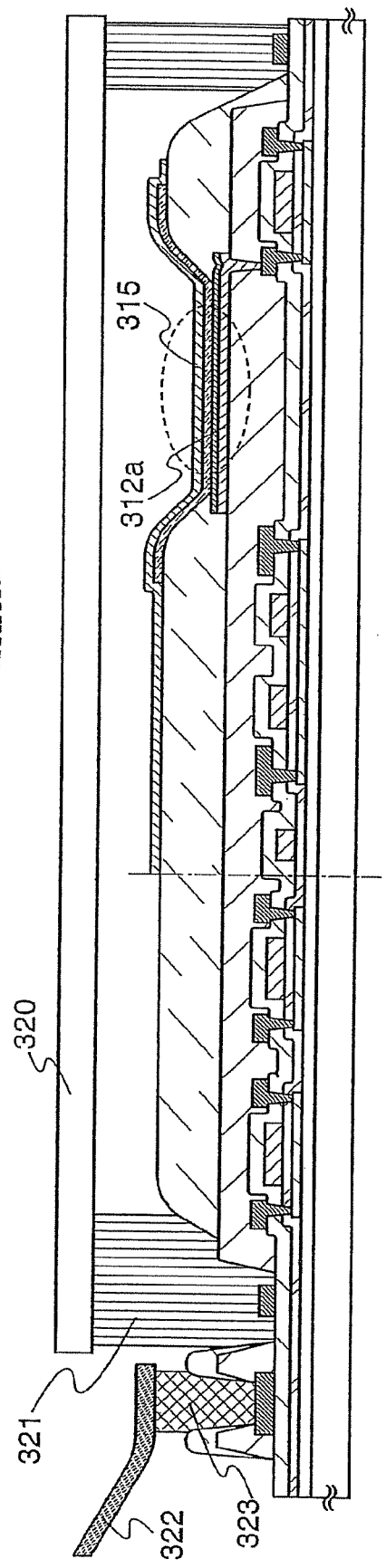

The interface between the light-emitting layer 314 and the first transport layer 351 and the interface between the light-emitting layer 314 and the second transport layer 352 may be unclear as shown by a dotted line in FIG. 17A. FIG. 17A is an enlarged view of the overlapping portion of the electrode 312, the light-emitting layer 314 and the electrode 315 (a portion surrounded by a dotted line in FIG. 17B). A mixed region of the light-emitting layer 314 and the first transport layer 351b is preferably formed so that an energy barrier between the light-emitting layer 314 and the first transport layer 351 can be changed smoothly. Further, a mixed region of the light-emitting layer 314 and the second transport layer 352b is preferably formed so that an energy barrier between the light-emitting layer 314 and the second transport layer 352 can be changed smoothly.

The electrode 315 may be an electrode in which the first layer 315a and the second layer 315b are stacked such that the second layer 315b exists closer to the light-emitting layer 314 than the first layer 315a. Herein, the second layer 315b is preferably a layer including a metal oxide and an organic compound. When holes are injected from the electrode 315, a hole transporting substance is preferably used as the organic compound and a substance showing electron accepting property to the hole transporting substance is preferably used as the metal oxide. When electrons are injected from the electrode 315, an electron transporting substance is preferably used as the organic compound and a substance selected from substances showing electron donating property to the electron transporting substance is preferably used as the metal oxide. Further, by adjusting the thickness of the second layer 315b, the optical path length of emitted light may be adjusted. Light with favorable color purity can be extracted efficiently by adjusting the optical path length.

Figure 7:
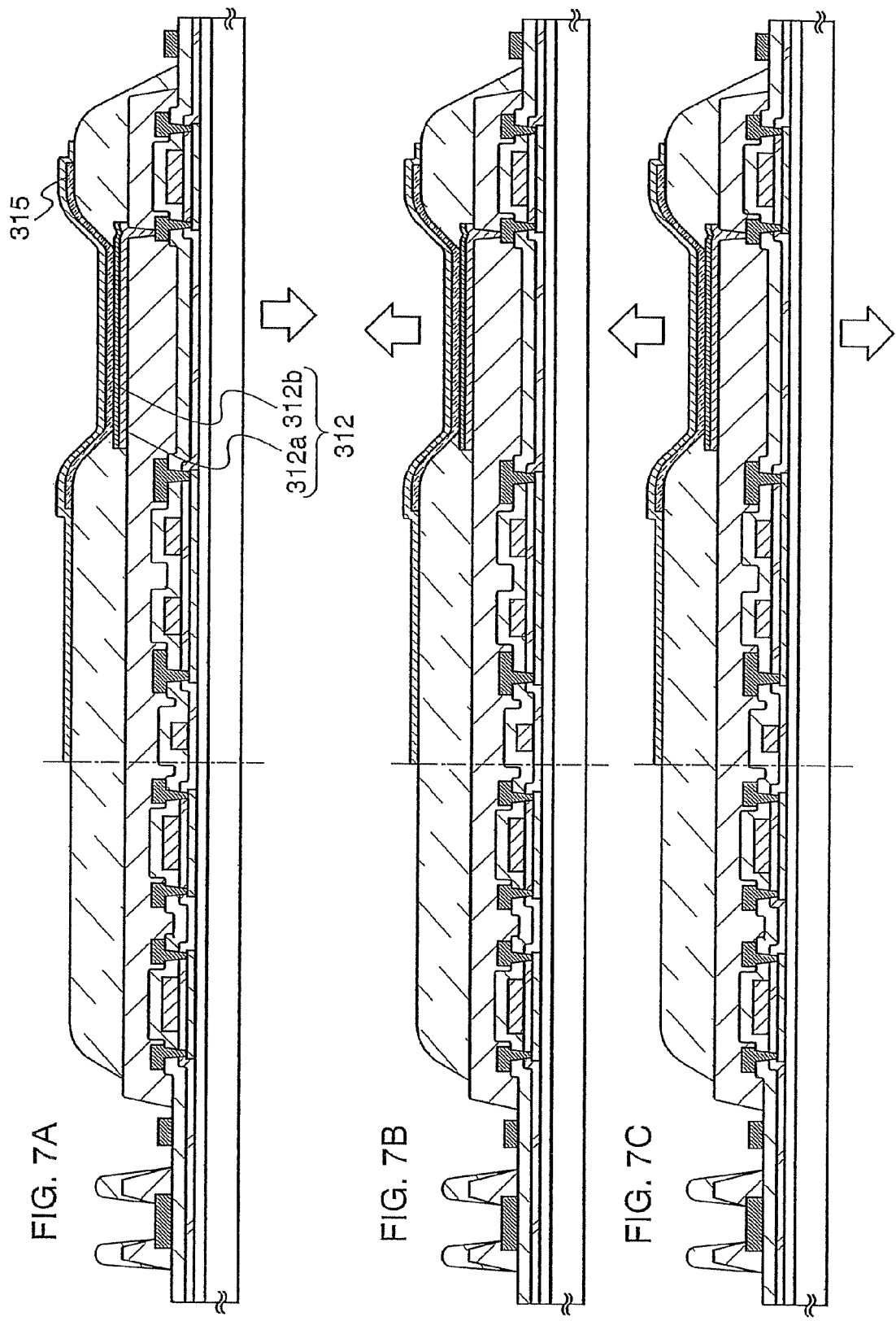
FIGS. 7A to 7C each show one mode of a light-emitting device to which the present invention is applied.

In the light-emitting device described above, light from the light-emitting layer 314 may be extracted through one side or both sides of the electrodes 312 and 315. When light is extracted through the electrode 312 as shown by an outline arrow in FIG. 7A, the first layer 312a is formed using indium tin oxide or the like such that visible light can transmit through the first layer. When light is extracted through the electrode 315 as shown by an outline arrow in FIG. 7B, the electrode 315 is formed using indium tin oxide or the like such that visible light can transmit through the electrode 315. When light is extracted from opposite sides, i.e., through the electrodes 312 and 315 as shown by an outline arrow in FIG. 7C, the first layer 312a and the electrode 315 are both formed using indium tin oxide or the like such that visible light can transmit through the first layer 312a and the electrode 315.

A light-emitting device provided with the light-emitting element 316 is preferably encapsulated by substrates 301, 320 and a sealing agent 321 so as not to expose the light-emitting element 316 to the air, as shown in FIG. 2C. In FIG. 2C, the substrate 301 is bonded to a substrate 320 by the sealing agent 321 so as to encapsulate the light-emitting element 316. The inside surrounded by substrates 301, 320 and the sealing agent 321 is filled with nitrogen, an inert gas, resin or the like. The conductive layer 307 is connected to a flexible printed circuit 322 by a conductive adhesive agent 323.

The light-emitting device described above is manufactured using a semiconductor device of the present invention; therefore, the light-emitting layer 314 can cover the electrode 315 with favorable coverage and a short circuit between the electrodes 312 and 315, or the like are difficult to be caused. In addition, end portions of the electrode 312 are covered by the partition layer 313. Thus, defects of a light-emitting element such as a short circuit between the electrodes 312 and 315 due to a concentrated electric field at the end portions of the electrode 312 can be prevented. As described above, a favorable light-emitting device in which defects such as a short circuit between electrodes are difficult to be caused, can be manufactured by using a semiconductor device of the present invention.

Embodiment Mode 3

One mode of a semiconductor device of the present invention is explained with reference to FIG. 3. An insulating layer 152 is provided on a substrate 151. Further, a transistor 161 including a semiconductor layer 153, a gate insulating layer 154, and a gate electrode 155 is provided over the insulating layer 152. The transistor 161 is covered with the insulating layers 156 and 157 having opening portions. Conductive layers 158a and 158b are provided over the insulating layer 156. Moreover, the conductive layers 158a and 158b are connected to the semiconductor layer 153 through the opening portion provided in the gate insulating layer 154 and the insulating layer 156 respectively. In addition, an electrode 159 including a first layer 159a and a second layer 159b is provided over the insulating layer 157. A part of the first layer 159a of the electrode 159 is stacked on the conductive layer 158a, and the electrode 159 is electrically connected to the conductive layer 158a. In addition, end portions of the electrode 159 are covered with a partition layer 160.

Note that the description of the substrate 101 is referred to for the substrate 151, the description of the insulating layer 102 is referred to for the insulating layer 152, the description of the semiconductor layer 103 is referred to for the semiconductor layer 153, the description of the gate insulating layer 104 is referred to for the gate insulating layer 154, and the description of the gate electrode 105 is referred to for the gate electrode 155. In addition, the description of the insulating layer 106 is referred to for the insulating layer 156, and the description of the insulating layer 108 is referred to for the insulating layer 157.

Figure 3:
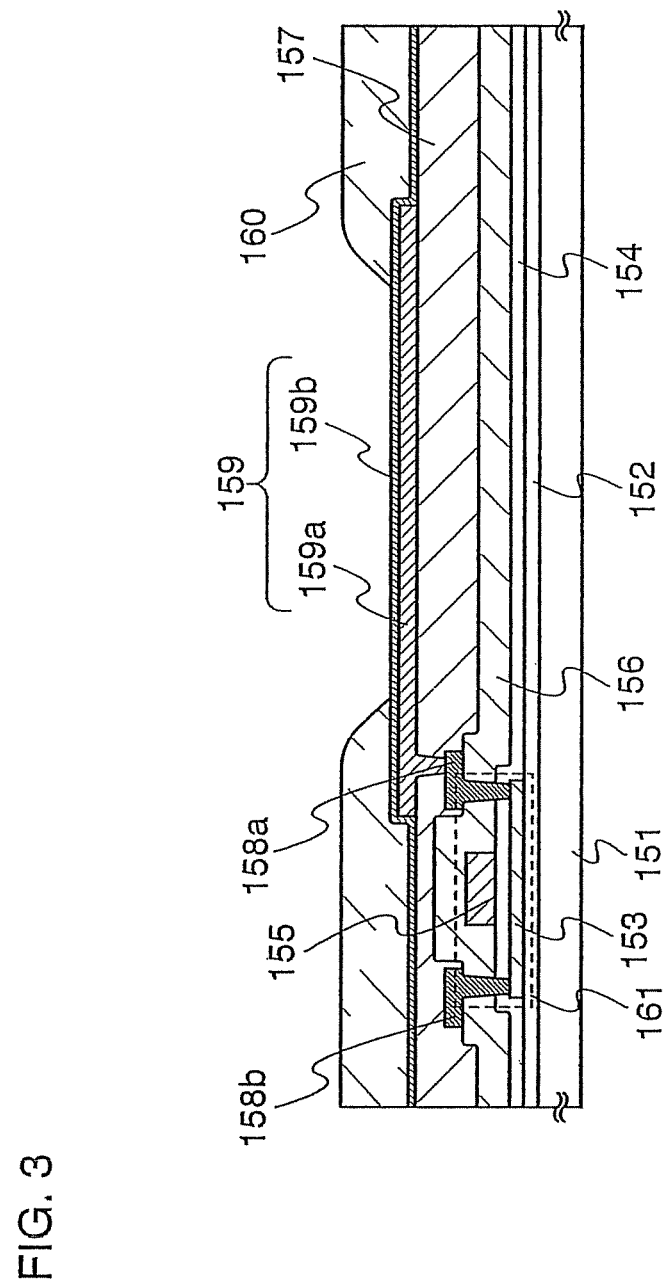
FIG. 3 shows one mode of a semiconductor device according to one aspect of the present invention.

The conductive layer 158a and the electrode 159 may be connected electrically by stacking the electrode 159 on the conductive layer 158a, like the semiconductor device shown in FIG. 3.

The first layer 159a corresponds to the first layer 109a, and the second layer 159b corresponds to the second layer 109b. Therefore, the description of the first layer 109a and the second layer 109b are referred to for the first layer 159a and the second layer 159b, respectively.

Like the semiconductor device shown in FIG. 3, it is possible to manufacture a light-emitting device in which defects such as a short circuit due to the unevenness of the electrode 159 are reduced by using a semiconductor device in which the electrode 159 including the first layer 159a and the second layer 159b is formed so that the end portions of the electrode 159 are covered with the partition layer 160. Moreover, a light-emitting device which has almost no defects such as short circuit or the like due to an electric field caused at end portions of an electrode, can be manufactured.

Embodiment Mode 4

Figure 4:
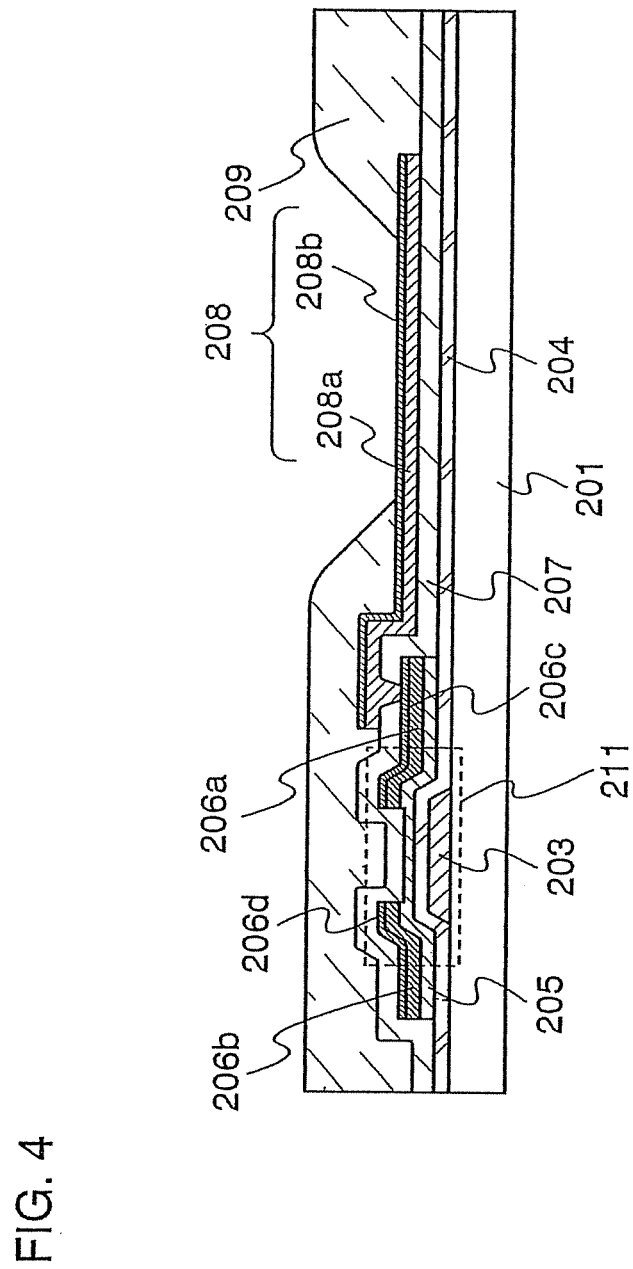
FIG. 4 shows one mode of a semiconductor device according to one aspect of the present invention.

Embodiment Mode 4 explains one mode of a semiconductor device including a channel-etch type bottom gate transistor of the present invention with reference to FIG. 4.

A transistor 211 including a gate electrode 203, a gate insulating layer 204, a first semiconductor layer 205, a second semiconductor layer 206a, and a second semiconductor layer 206b is provided over a substrate 201. The gate electrode 203 is provided over the substrate 201. In addition, the gate insulating layer 204 is provided to cover the gate electrode 203. Further, the first semiconductor layer 205 is provided to be in contact with the gate insulating layer 204 over an overlapping portion of the gate electrode 203 and the gate insulating layer 204. The second semiconductor layers 206a and 206b are each in contact with the first semiconductor layer 205, and one of the second semiconductor layers 206a and 206b is provided to serve as a source, and the other, serve as a drain of the transistor. The second semiconductor layer 206a is stacked over the conductive layer 206c. Moreover, the conductive layer 206d is stacked over the second semiconductor layer 206b. An insulating layer 207 having an opening portion is provided to cover the transistor 211, the conductive layers 206c, 206d and the like. An electrode 208 is formed over the insulating layer 207. The electrode 208 includes a first layer 208a and a second layer 208b, and the first layer 208a is in contact with the insulating layer 207. Further, the electrode 208 covers the opening portion provided in the insulating layer 207, and is in contact with the conductive layer 206c. In addition, a partition layer 209 having an opening portion is provided to cover end portions of the electrode 208 over the insulating layer 207. Further, the electrode 208 is exposed by the opening portion provided in the partition layer 209.

The electrode 208 can be used as an electrode of a light-emitting element. Here, the first layer 208a is formed with a conductive substance as well as the first layer 109a shown in embodiment mode 1. In addition, the second layer 208b includes a metal oxide and an organic compound as well as the second layer 109b shown in Embodiment Mode 1. It is preferable for the first layer 208a and the second layer 208b to be formed in the same way as the first layer 109a and the second layer 109b respectively.

In the electrode 208, since the first layer 208a is covered with the second layer 208b, the unevenness formed on the surface of the first layer is reduced so that the electrode has favorable smoothness. It is possible to manufacture a favorable light-emitting device in which defects are reduced such as a short circuit or the like between the electrodes of the light-emitting element due to the unevenness of the electrode 208 by using a semiconductor device including such an electrode of the present invention.

Note that the description of the substrate 101 is referred to for the substrate 201, the description of the gate electrode 105 is referred to for the gate electrode 203, the description of the gate insulating layer 104 is referred to for the gate insulating layer 204, and the description of the semiconductor layer 103 is referred to for the first semiconductor layer 205. The second semiconductor layers 206a and 206b each include an n-type impurity and are formed with a semiconductor such as silicon or silicon germanium. There are no limitations on crystallinity of the second semiconductor layers 206a and 206b, and the second semiconductor layers 206a and 206b may include one or both of an amorphous semiconductor or a crystalline semiconductor. The description of conductive layers 107a and 107b are referred to for the conductive layers 206c and 206d. In addition, the description of the insulating layer 106 is referred to for the insulating layer 207, and the description of the partition layer 110 is referred to for the partition layer 209.

Embodiment Mode 5

Figure 5:
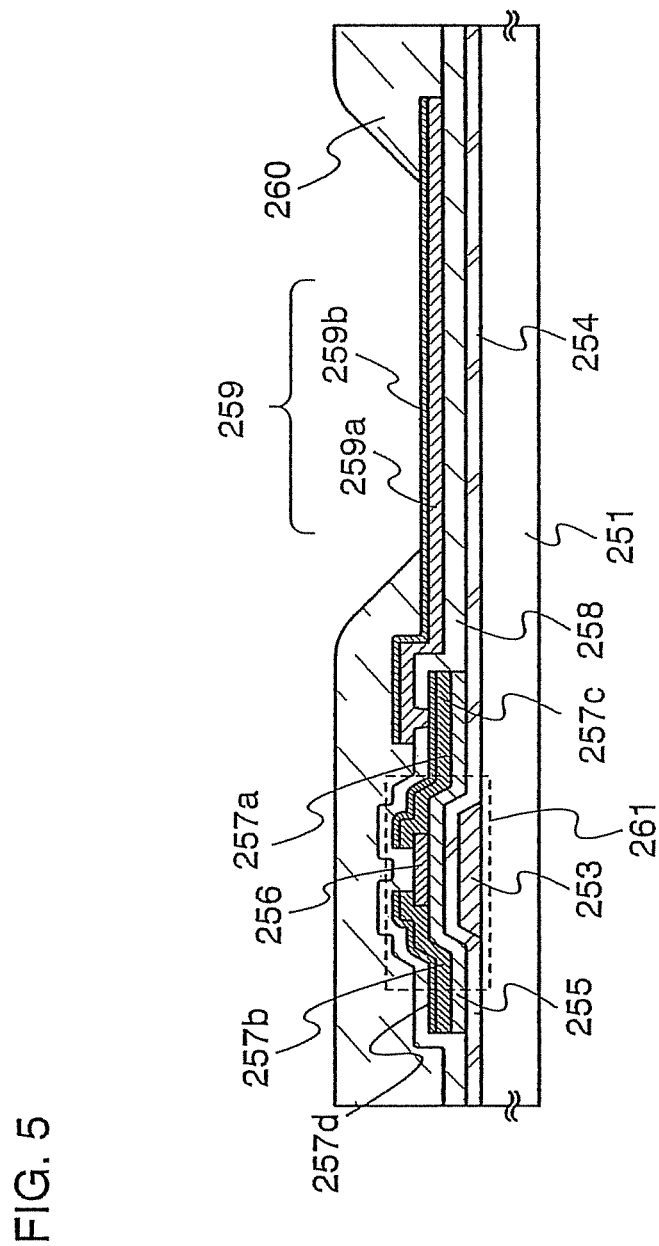
FIG. 5 shows one mode of a semiconductor device according to one aspect of the present invention.

Embodiment Mode 5 shows one mode of a semiconductor device including a channel-stop type bottom gate transistor of the present invention in FIG. 5.

A transistor 261 including a gate electrode 253, a gate insulating layer 254, a first semiconductor layer 255, a second semiconductor layer 257a, and a second semiconductor layer 257b is provided over a substrate 251. The gate electrode 253 is provided over the substrate 251. In addition, the gate insulating layer 254 is provided to cover the gate electrode 253. Further, the first semiconductor layer 255 is provided to be in contact with the gate insulating layer 254 over the overlapping portion of the gate electrode 253 and the gate insulating layer 254. The second semiconductor layers 257a and 257b are each in contact with the first semiconductor layer 255, and one of the second semiconductor layers 257a and 257b is provided to serve as a source, and the other serve as a drain of the transistor. A protective layer 256 is provided over a region where a channel is formed in the first semiconductor layer 255. The second semiconductor layer 257a is stacked over a conductive layer 257c. Moreover, a conductive layer 257d is stacked over the second semiconductor layer 257b. An insulating layer 258 having an opening portion is provided to cover the transistor 261, and the conductive layers 257c and 257d. An electrode 259 is provided over the insulating layer 258. The electrode 259 includes a first layer 259a and a second layer 259b, and the first layer 259a is in contact with the insulating layer 258. Further, the electrode 259 covers the opening portion provided in the insulating layer 258, and is in contact with the conductive layer 257c. In addition, a partition layer 260 having an opening portion is provided to cover the end portions of the electrode 259 over the insulating layer 258. Moreover, the electrode 259 is exposed by the opening portion provided in the partition layer 260.

As described above, the semiconductor device shown in FIG. 5 includes a bottom gate type transistor having a different mode from the one shown in Embodiment Mode 4.

The electrode 259 can be used as an electrode of a light-emitting element. Here, the first layer 259a is formed with a conductive substance in the same way as the first layer 109a shown in Embodiment Mode 1. In addition, the second layer 259b includes a metal oxide and an organic compound in the same way as the second layer 109b shown in Embodiment Mode 1. It is preferable for the first layer 259a and the second layer 259b to be formed in the same way as the first layer 109a and the second layer 109b respectively.

In the electrode 259, since the first layer 259a is covered with the second layer 259b, the unevenness formed on the surface of the first layer is reduced so that the electrode has favorable smoothness. It is possible to manufacture a favorable light-emitting device in which defects are reduced such as a short circuit or the like between electrodes of the light-emitting element due to the unevenness of the electrode 259 by using a semiconductor device including such an electrode of the present invention.

Note that the description of the substrate 101 is referred to for the substrate 251, the description of the gate electrode 105 is referred to for the gate electrode 253, the description of the gate insulating layer 104 is referred to for the gate insulating layer 254, and the description of the semiconductor layer 103 is referred to for the first semiconductor layer 255. Second semiconductor layers 257a and 257b each include an n-type impurity and are formed with a semiconductor such as silicon or silicon germanium. There are no limitations on crystallinity of the second semiconductor layers 257a and 257b, and the second semiconductor layers 257a and 257b may include one or both of an amorphous semiconductor or a crystalline semiconductor. The description of conductive layers 107a and 107d is referred to for the conductive layers 257c and 257d. In addition, the description of the insulating layer 106 is referred to for the insulating layer 258, and the description of the partition layer 110 is referred to for the partition layer 260. In addition, the protective layer 256 has a function of protecting the first semiconductor layer 255 so that the first semiconductor layer 255 is not etched when the second semiconductor layers 257a and 257b and the conductive layers 257c and 257d are processed. The protective layer 256 may be formed with silicon nitride or the like.

Embodiment Mode 6

Figure 6:
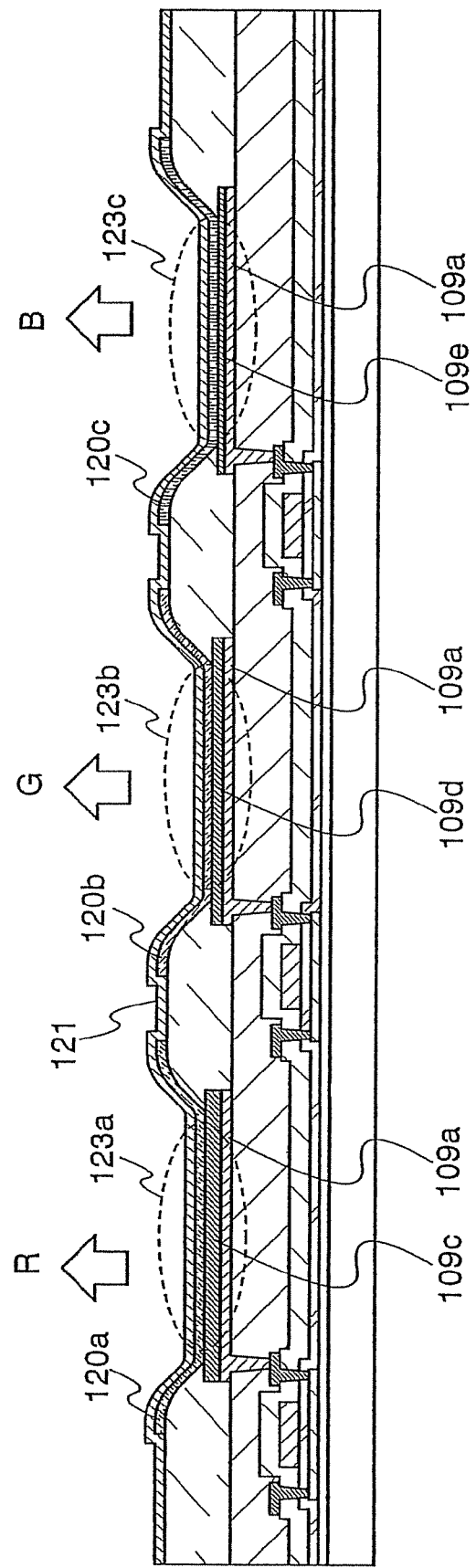
FIG. 6 shows one mode of a light-emitting device formed by using a semiconductor device of the present invention.

One mode of a light-emitting device using a semiconductor device of the present invention shown in FIG. 1 is explained with reference to FIG. 6. The light-emitting device shown in FIG. 6 is manufactured by using a semiconductor device having second layers 109c, 109d, and 109e formed to have different thicknesses from each other.

The first layer 109a is formed with aluminum or the like and is a layer with high reflectance. A light-emitting layer 120a including a light-emitting material emitting reddish light is formed over the second layer 109c. In addition, a light-emitting layer 120b including a light-emitting material emitting greenish light is provided over the second layer 109d. Further, a light-emitting layer 120c including a light-emitting material emitting bluish light is provided over the second layer 109e. In addition, an electrode 121 is formed with indium tin oxide or the like, and can transmit visible light.

Each of light emitted from light-emitting elements 123a, 123b, and 123c is extracted from the side of the electrode 121.

The thickness of the second layer 109c is adjusted depending on a wavelength of emitted light so as to extract the light with good color purity from the side of the electrode 121. Further, the thickness of the second layer 109d is adjusted depending on a wavelength of emitted light so as to extract the light with good color purity from the side of the electrode 121. In addition, the thickness of the second layer 109e is adjusted depending on a wavelength of emitted light so as to extract the light with good color purity from the side of the electrode 121.

As described above, a light-emitting device including a plurality of light-emitting elements which emit different emission colors can be manufactured by using a semiconductor device of the present invention. Further, the semiconductor device of the present invention can adjust an optical path length so as to extract light with good color purity from each of light-emitting elements.

Embodiment Mode 7

In Embodiment Mode 7, a circuit configuration and a driving method of a light-emitting device having a display function are explained with reference to FIGS. 8 to 11. The light-emitting device in this embodiment mode is a light-emitting device that is manufactured by a semiconductor device of the present invention as described in Embodiment Mode 2 or 6.

Figure 8:
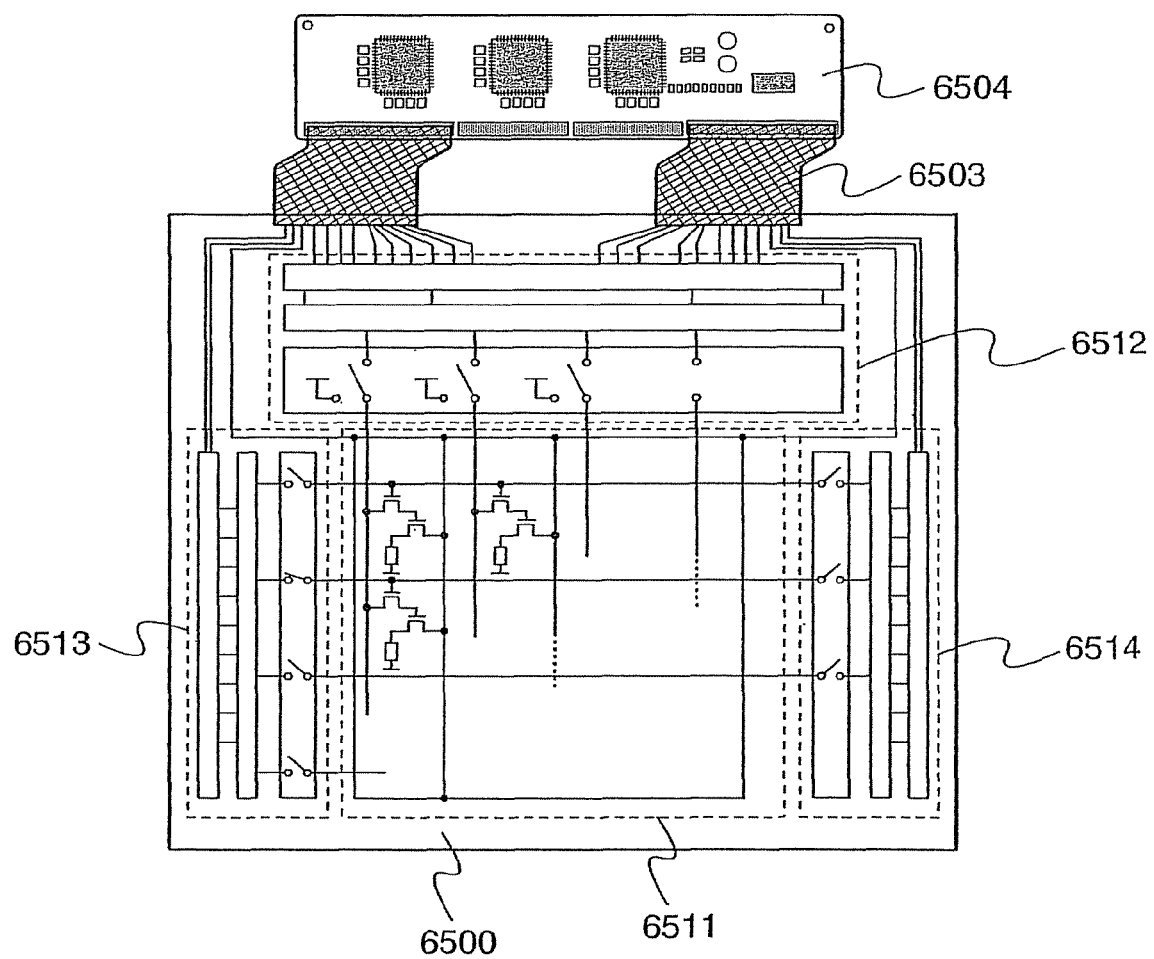
FIG. 8 shows one mode of a light-emitting device to which the present invention is applied.

FIG. 8 is a schematic view of a top face of a light-emitting device manufactured by a semiconductor device of the present invention. A pixel portion 6511, a source signal line driver circuit 6512, a writing gate signal line driver circuit 6513, and an erasing gate signal line driver circuit 6514 are provided on a substrate 6500 in FIG. 8. The source signal line driver circuit 6512, the writing gate signal line driver circuit 6513, and the erasing gate signal line driver circuit 6514 are each connected to an FPC (flexible printed circuit) 6503 that is an external input terminal via a wiring group. Each of the source signal line driver circuit 6512, the writing gate signal line driver circuit 6513, and the erasing gate signal line driver circuit 6514 receives a video signal, a clock signal, a start signal, a reset signal, and the like from the FPC 6503. A printed wiring board (PWB) 6504 is attached to the FPC 6503. The driver circuit portion is not always required to be provided on the same substrate as the pixel portion 6511. For example, the driver circuit portion may be formed outside the substrate by using TCP or the like that is formed by mounting an IC chip on an FPC provided with a wiring pattern.

In the pixel portion 6511, a plurality of source signal lines extending in a column direction are arranged in a row direction. Current supply lines are also arranged in the row direction. In the pixel portion 6511, a plurality of gate signal lines extending in the row direction are arranged in the column direction. In the pixel portion 6511, a plurality of circuits each including a light-emitting element are arranged.

Figure 9:
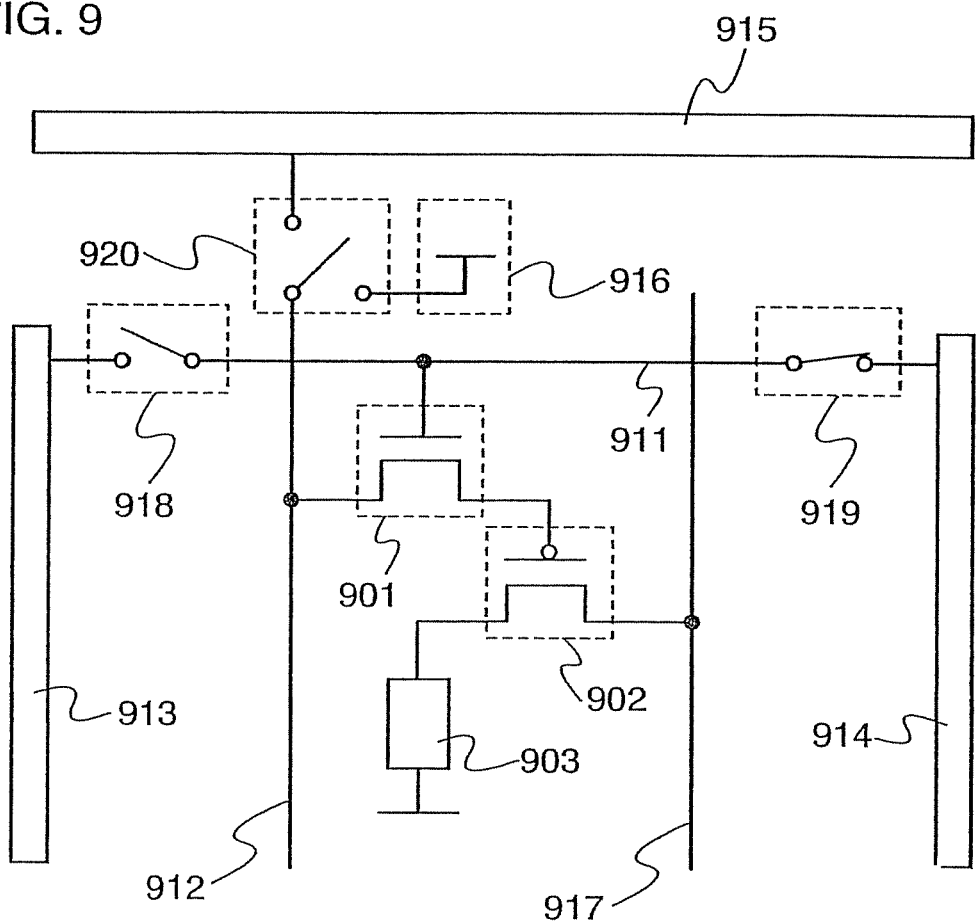
FIG. 9 shows a circuit included in a light-emitting device to which the present invention is applied.

FIG. 9 shows a circuit for operating one pixel. The circuit shown in FIG. 9 includes a first transistor 901, a second transistor 902, and a light-emitting element 903.

Each of the first transistor 901 and the second transistor 902 is a three-terminal element including a gate electrode, a drain region, and a source region, in which a channel region is formed between the drain region and the source region. Because the source region and the drain region are interchanged depending on a structure, an operational condition or the like of the transistor, it is difficult to distinguish the source region from the drain region. In this embodiment mode, regions to serve as a source and a drain are referred to as a first electrode and a second electrode.

A gate signal line 911 and a writing gate signal line driver circuit 913 are provided to be electrically connected or not to be electrically connected with each other via a switch 918. The gate signal line 911 and an erasing gate signal line driver circuit 914 are provided to be electrically connected or not to be electrically connected with each other via a switch 919. A source signal line 912 is provided to be electrically connected to either a source signal line driver circuit 915 or a power source 916 via a switch 920. A gate of the first transistor 901 is electrically connected to the gate signal line 911. The first electrode of the first transistor 901 is electrically connected to the source signal line 912, and the second electrode of the first transistor 901 is electrically connected to the gate electrode of the second transistor 902. The first electrode of the second transistor 902 is electrically connected to a current supply line 917, and the second electrode of the second transistor 902 is electrically connected to one electrode included in the light-emitting element 903. The switch 918 may be included in the writing gate signal line driver circuit 913. The switch 919 may also be included in the erasing gate signal line driver circuit 914. The switch 920 may also be included in the source signal line driver circuit 915.

Figure 10:
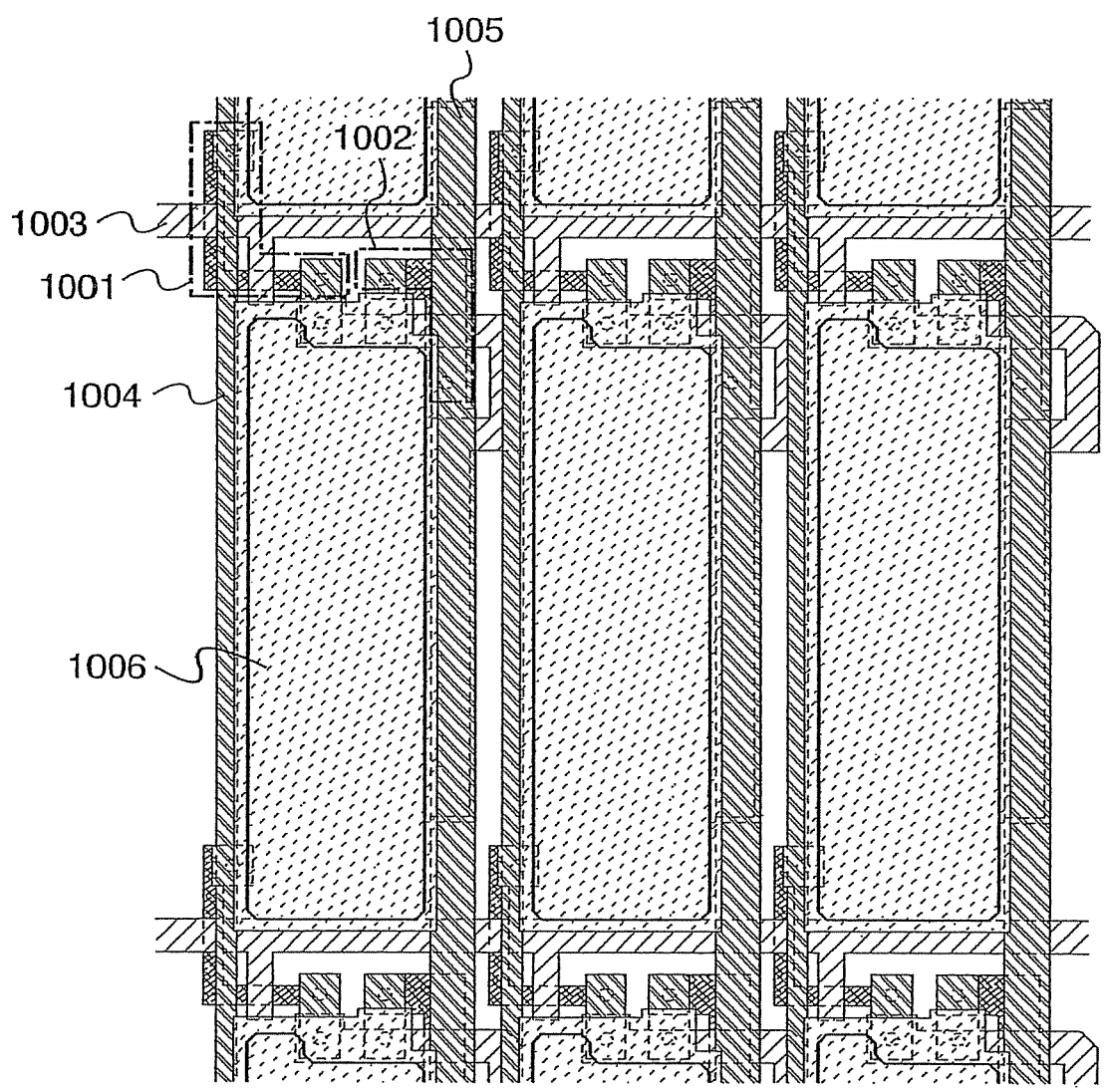
FIG. 10 is a top view showing one mode of a light-emitting device to which the present invention is applied.

The arrangement of a transistor, a light-emitting element and the like in the pixel portion is not necessarily limited. For example, the elements can be arranged as shown in a top view of FIG. 10. In FIG. 10, a first electrode of a first transistor 1001 is connected to a source signal line 1004, and a second electrode of the first transistor 1001 is connected to a gate electrode of the second transistor 1002. A first electrode of the second transistor 1002 is connected to a current supply line 1005, and a second electrode of the second transistor 1002 is connected to an electrode 1006 of a light-emitting element. A part of a gate signal line 1003 serves as a gate electrode of the first transistor 1001.

Figure 11:
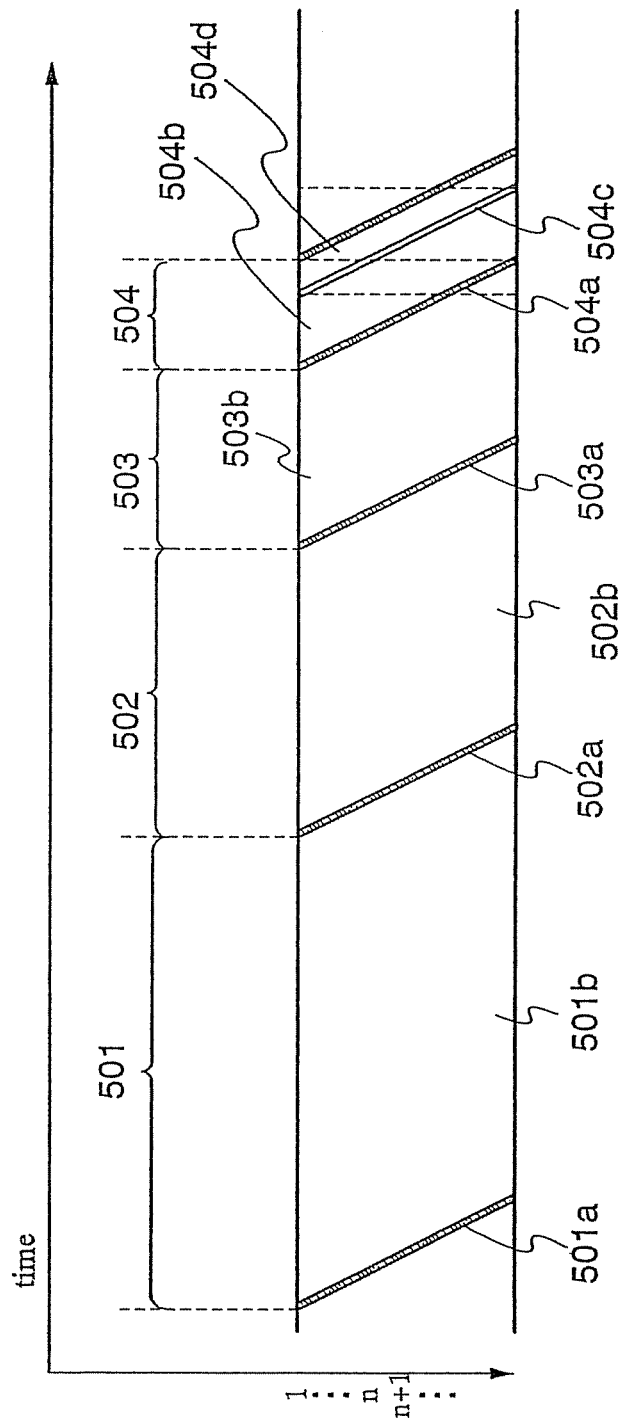
FIG. 11 shows one mode of a frame operation of a light-emitting device applied the present invention.

Next, a driving method is explained. FIG. 11 is an explanatory view of an operation of a frame with time. In FIG. 11, the abscissa-axis direction represents time passage, whereas the ordinate-axis direction represents scanning stages of a gate signal line.

When an image is displayed with a light-emitting device according to the present invention, a rewriting operation and a displaying operation for the image are repeatedly carried out in a display period. The number of rewriting operations is not necessarily limited; however, the rewriting operation is preferably performed approximately sixty times per one second so that a person who watches the image does not find flickering. Herein, the period when the operations of rewriting and displaying of one image (one frame) are carried out is referred to as one frame period.

One frame period is time-divided into four sub frame periods 501, 502, 503, and 504 including write periods 501a, 502a, 503a, and 504a, and retention periods 501b, 502b, 503b, and 504b. A light-emitting element that receives a light-emission signal emits light in the retention period. The length ratio of the retention period in each of the first sub frame period 501, the second sub frame period 502, the third sub frame period 503, and the fourth sub frame period 504 is $2^3:2^2:2^1:2^0=8:4:2:1$. Accordingly, a 4-bit gray scale can be realized. The number of bits or gray scale levels is not limited thereto. For instance, an 8-bit gray scale can be offered by providing eight sub frame periods.

An operation in one frame period is explained. Firstly, a writing operation is carried out from the first row to the last row sequentially in the sub frame period 501. Therefore, the starting time of a write period is different depending on the rows. The retention period 501b starts in the row where the write period 501a is completed. In the retention period, a light-emitting element that receives a light-emission signal emits light. The sub frame period 502 starts in the row where the retention period 501b is completed, and a writing operation is carried out from the first row to the last row sequentially as is the case with the sub frame period 501. Operations as noted above are repeatedly carried out to finish the retention period 504b of the sub frame period 504. When an operation in the sub frame period 504 is finished, an operation in the next frame period is started. The sum of emitting light in each of the sub frame periods is an emitting time of each light-emitting element in one frame period. By varying the emitting time depending on each light-emitting element to be variously combined in one pixel, various colors can be displayed with different brightness and chromaticity.

As in the sub frame 504, when a retention period in the row where writing has been finished and the retention period has started is intended to be forcibly terminated before finishing the writing of the last row, an erase period 504c is preferably provided after the retention period 504b to control so that the light-emission is forcibly stopped. The row where the light-emission is forcibly stopped does not emit light during a fixed period (the period is referred to as a non-light emission period 504d). Upon finishing the write period of the last row, the next write period (or a frame period) starts from the first row. This makes it possible to prevent from the write period of the sub frame 504 from overlapping a write period of the next sub frame period.

In this embodiment mode, the sub frame periods 501 to 504 are arranged in the order from the longest retention period; however, the present invention is not limited thereto. For instance, the sub frame periods 501 to 504 may be arranged in the order from the shortest retention period. The sub frame periods 501 to 504 may be arranged at random combining short sub frame periods and long sub frame periods. The sub frame period may be further divided into a plurality of frame periods. That is, scanning of the gate signal line may be carried out a plurality of times during the period of giving the same video signal.

An operation in a write period and an erase period of a circuit shown in FIG. 9 is explained.

First, an operation in the write period is explained. In the write period, the gate signal line 911 in the n-th row (n is a natural number) is electrically connected to the writing gate signal line driver circuit 913 via the switch 918. The gate signal line 911 is not connected to the erasing gate signal line driver circuit 914. The source signal line 912 is electrically connected to the source signal line driver circuit 915 via the switch 920. A signal is inputted to the gate of the first transistor 901 connected to the gate signal line 911 in the n-th row, and the first transistor 901 is turned ON. At this time, video signals are simultaneously inputted to the source signal lines in the first column to the last column. Video signals inputted from the source signal line 912 at each column are independent from each other. The video signal inputted from the source signal line 912 is inputted to the gate electrode of the second transistor 902 via the first transistor 901 connected to each source signal line. At this time, the signal inputted to the second transistor 902 determines a value of a current supplied to the light-emitting element 903 from a current supply line 917. Emission or non-emission of the light-emitting element 903 is determined depending on the current value. For example, in the case that the second transistor 902 is a p-channel type, the light-emitting element 903 emits light when a Low Level signal is inputted to the gate electrode of the second transistor 902. On the other hand, in the case that the second transistor 902 is an n-channel type, the light-emitting element 903 emits light when a High Level signal is inputted to the gate electrode of the second transistor 902.

Then, an operation in the erase period is explained. In the erase period, the gate signal line 911 of the n-th row (n is a natural number) is electrically connected to the erasing gate signal line driver circuit 914 via the switch 919. The gate signal line 911 is not connected to the writing gate signal line driver circuit 913. The source signal line 912 is electrically connected to the power source 916 via the switch 920. A signal is inputted to the gate of the first transistor 901 connected to the gate signal line 911 in the n-th row, and the first transistor 901 is turned ON. At this time, erase signals are simultaneously inputted to the source signal lines in the first column to the last column. The erase signal inputted from the source signal line 912 is inputted to the gate electrode of the second transistor 902 via the first transistor 901 connected to each source signal line. By the signal inputted to the second transistor 902, current supply from the current supply line 917 to the light-emitting element 903 is stopped. The light-emitting element 903 does not emit light forcibly. For example, in the case that the second transistor 902 is a p-channel type, the light-emitting element 903 does not emit light when a High Level signal is inputted to the gate electrode of the second transistor 902. On the other hand, in the case that the second transistor 902 is an n-channel type, the light-emitting element 903 does not emit light when a Low Level signal is inputted to the gate electrode of the second transistor 902.

In the erase period, a signal for erasing is inputted to the n-th (n is a natural number) row by the operation as described above. However, there is a case that the n-th row is in an erase period and another row (the m-th row, m is a natural number) is in a write period. In this instance, it is required that a signal for erasing is inputted to the n-th row and a signal for writing is inputted to the m-th row by utilizing a source signal line of the same column. Accordingly, an operation explained as follows is preferably carried out.

Immediately after the light-emitting element 903 in the n-th row is brought into a non emission state by the operation in the erase state described above, the gate signal line 911 is disconnected from the erasing gate signal line driver circuit 914, and the source signal line 912 is connected to the source signal line driver circuit 915 by changing the switch 920. As well as connecting the source signal line 912 to the source signal line driver circuit 915, the gate signal line 911 is connected to the writing gate signal line driver circuit 913. A signal is selectively inputted to the signal line in the m-th row from the writing gate signal line driver circuit 913, and when the first transistor is turned ON, signals for writing are inputted to the source signal lines in the first column to the last column from the source signal line driver circuit 915. The light-emitting element in the m-th row emits light or no light depending on the signal.

Immediately after finishing the write period of the m-th row as noted above, an erase period in the (n+1)-th row starts. Hence, the gate signal line 911 and the writing gate signal line driver circuit 913 are disconnected, and the source signal line 912 and the power source 916 are connected by changing the switch 920. Further, the gate signal line 911 and the writing gate signal line driver circuit 913 are disconnected, and the gate signal line 911 is connected to the erasing gate signal line driver circuit 914. When a signal is selectively inputted to the gate signal line in the (n+1)-th row from the erasing gate signal line driver circuit 914, and the first transistor 901 is turned ON, an erase signal is inputted from the power source 916. Immediately after finishing the erase period in the (n+1)-th row, a write period in the (m+1)-th row starts. Hereinafter, an erase period and a write period may be carried out repeatedly to operate to complete an erase period of the last row.

In this embodiment mode, a mode in which the write period in the m-th row is provided between the erase period of the n-th row and the erase period of the (n+1)-th row is explained. Without being limited to this, however, the write period of the m-th row may be provided between the erase period at (n−1)-th row and the erase period in the n-th row.

In this embodiment mode, when providing the non-light emission period 504d as in the sub frame period 504, an operation of disconnecting the erasing gate signal line driver circuit 914 from a certain gate signal line and connecting the writing gate signal line driver circuit 913 to another gate signal line is repeatedly carried out. Such an operation may be carried out in a frame period that is not provided with a non-light emission period.

Embodiment Mode 8

Electronic devices each having a light-emitting device or the like manufactured using a semiconductor device of the present invention are described. The light-emitting device incorporated in the electronic devices described in this embodiment mode is formed according to the present invention, operation defects due to a short circuit between electrodes of a light-emitting element can be suppressed. Thus, the light-emitting device can display a favorable image. Therefore, the electronic device incorporating such a light-emitting device can provide various types of information to users, without lack of information or misconception caused by a fuzzy image.

Figure 12A:
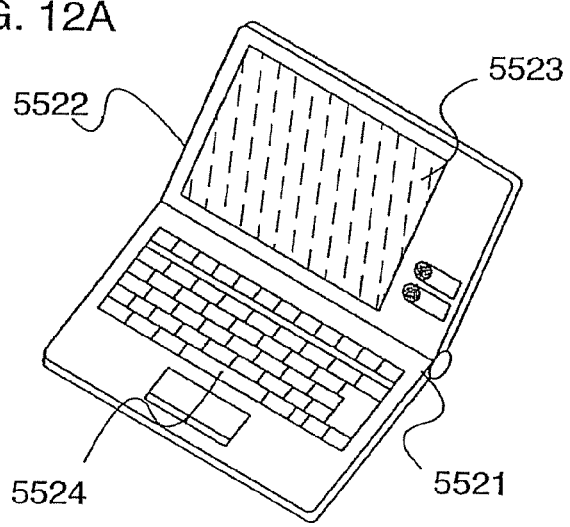
FIGS. 12A to 12C each show one mode of an electronic device to which the present invention is applied.

FIG. 12A illustrates a lap top personal computer manufactured according to the present invention. The lap top personal computer includes a main body 5521, a casing 5522, a display portion 5523, a keyboard 5524, and the like. The personal computer can be completed by incorporating a light-emitting device formed using a semiconductor device of the present invention as the display portion.

Figure 12B:
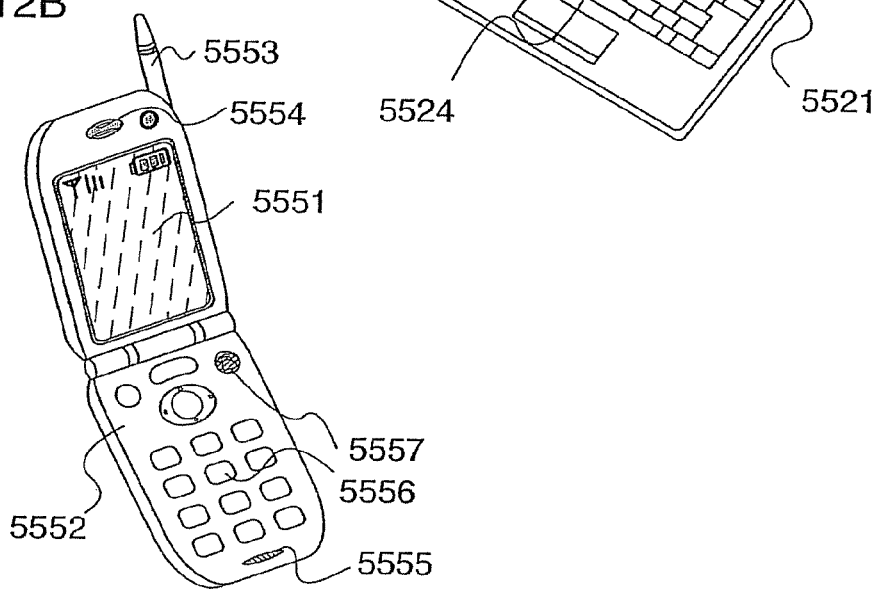

FIG. 12B illustrates a telephone set manufactured according to the present invention. The telephone set includes a main body 5552, a display portion 5551, a sound output portion 5554, a sound input portion 5555, operation switches 5556, 5557, an antenna 5553, and the like. The telephone set can be completed by incorporating a light-emitting device formed using a semiconductor device of the present invention as the display portion.

Figure 12C:
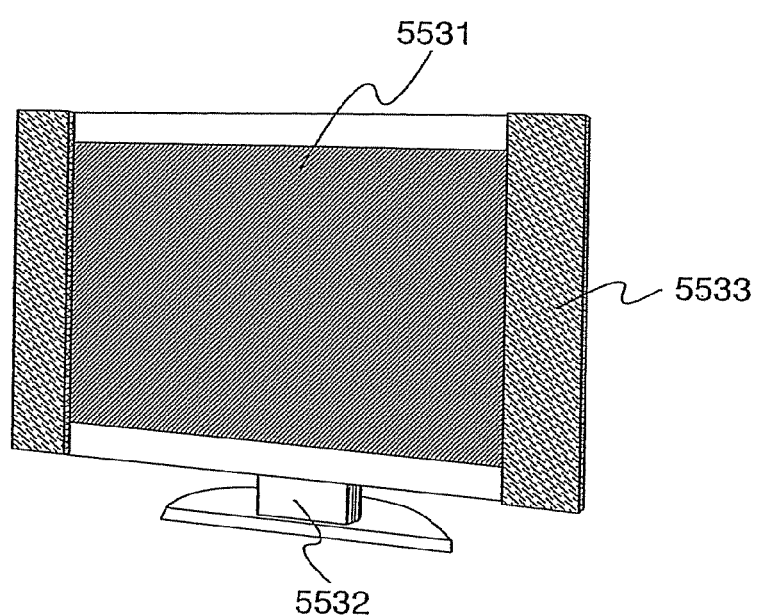

FIG. 12C illustrates a television set manufactured according to the present invention. The television set includes a display portion 5531, a casing 5532, a speaker 5533, and the like. The television set can be completed by incorporating a light-emitting device formed using a semiconductor device of the present invention as the display portion.

As noted above, the light-emitting device according to the present invention is extremely suitable to be used as a display portion of various kinds of electronic devices.

The personal computer, the telephone set and the television set are explained in this embodiment mode. Besides, a light-emitting device formed using a semiconductor device of the present invention may be mounted to a navigation system, a lighting system, and the like.

This application is based on Japanese Patent Application serial no. 2004-318703 filed in Japan Patent Office on 2 Nov. 2004, the entire contents of which are hereby incorporated by reference.

What is claim is:

1. A semiconductor device comprising:
   a transistor;
   a first electrode electrically connected to the transistor and serving as an electrode of a light-emitting element, the first electrode comprising a first layer and a second layer over the first layer; and
   a partition layer covering an end portion of the first electrode and comprising an opening portion to expose a part of the second layer,
   wherein the first layer comprises a conductive substance,
   wherein the second layer comprises an electron transporting substance and a substance showing electron donating property to the electron transporting substance, and
   wherein the partition layer is in contact with a top surface of the second layer.

2. The semiconductor device according to claim 1, wherein the second layer is 100 nm to 300 nm thick.

3. The semiconductor device according to claim 1, wherein the substance showing electron donating property is one selected from lithium oxide, calcium oxide and magnesium oxide.

4. A light-emitting device comprising:
   a semiconductor device according to claim 1;
   a light-emitting layer; and
   a second electrode,
   wherein the first electrode, the light-emitting layer and the second electrode are overlapped with each other.

5. The light-emitting device according to claim 4, wherein the second layer is 100 nm to 300 nm thick.

6. An electronic device using the light-emitting device according to claim 4 in a display portion.

7. The light-emitting device according to claim 4, wherein the substance showing electron donating property is one selected from lithium oxide, calcium oxide and magnesium oxide.

8. The semiconductor device according to claim 1, further comprising an insulating layer over the transistor,
   wherein the first layer is in contact with the insulating layer.

9. A semiconductor device comprising:
   a first transistor;
   a first electrode electrically connected to the first transistor and serving as an electrode of a first light-emitting element;
   a second transistor;
   a second electrode electrically connected to the second transistor and serving as an electrode of a second light-emitting element; and
   a partition layer covering an end portion of the first electrode and an end portion of the second electrode,
   wherein each of the first electrode and the second electrode comprises:
     a first layer comprising a conductive substance; and
     a second layer over the first layer, the second layer comprising an electron transporting substance and a substance showing electron donating property to the electron transporting substance,
   wherein the partition layer comprises at least a first opening portion to expose a part of the second layer of the first electrode and a second opening portion to expose a part of the second layer of the second electrode,
   wherein the partition layer is in contact with a top surface of the second layer of the first electrode and a top surface of the second layer of the second electrode, and
   wherein an emission color of the first light-emitting element is different from an emission color of the second light-emitting element and a thickness of the second layer of the first electrode is different from a thickness of the second layer of the second electrode.

10. The semiconductor device according to claim 9, wherein the second layer is 100 nm to 300 nm thick.

11. The semiconductor device according to claim 9, wherein the substance showing electron donating property is one selected from lithium oxide, calcium oxide and magnesium oxide.

12. The semiconductor device according to claim 9, further comprising an insulating layer over the first transistor and the second transistor,
   wherein the first layer of the first electrode and the first layer of the second electrode are in contact with the insulating layer.

* * * * *